(12) United States Patent
Matsunami et al.

(10) Patent No.: US 8,187,728 B2
(45) Date of Patent: May 29, 2012

(54) ORGANIC ELECTROLUMINESCENT DEVICE AND DISPLAY DEVICE

(75) Inventors: Shigeyuki Matsunami, Kanagawa (JP); Yasunori Kijima, Tokyo (JP)

(73) Assignee: Sony Corporation, Tokyo (JP)

( * ) Notice: Subject to any disclaimer, the term of this patent is extended or adjusted under 35 U.S.C. 154(b) by 769 days.

(21) Appl. No.: 12/173,542

(22) Filed: Jul. 15, 2008

(65) Prior Publication Data
US 2009/0026935 A1   Jan. 29, 2009

(30) Foreign Application Priority Data

Jul. 23, 2007   (JP) ................. 2007-190982
Jul. 23, 2007   (JP) ................. 2007-190984
Jul. 23, 2007   (JP) ................. 2007-190985

(51) Int. Cl.
*H01L 51/54*     (2006.01)
(52) U.S. Cl. ........ 428/690; 428/917; 313/504; 313/505; 313/506; 548/440; 564/426; 564/434; 257/40; 257/E51.026
(58) Field of Classification Search .......... 428/690, 428/917; 313/504, 505, 506; 548/440; 564/426, 564/434; 257/40, E51.026
See application file for complete search history.

(56) References Cited

U.S. PATENT DOCUMENTS

| | | | |
|---|---|---|---|
| 5,540,999 A * | 7/1996 | Yamamoto et al. | 428/411.1 |
| 6,437,373 B1 * | 8/2002 | Sakai et al. | 257/103 |
| 2004/0062950 A1 * | 4/2004 | Iwanaga | 428/690 |
| 2004/0070808 A1 * | 4/2004 | Nakanishi | 359/245 |
| 2008/0085422 A1 * | 4/2008 | Mitsuya | 428/690 |

FOREIGN PATENT DOCUMENTS

| | | |
|---|---|---|
| JP | 04-304466 | * 10/1992 |
| JP | 7-126226 | 5/1995 |
| JP | 09-268284 | 10/1997 |
| JP | 10-219242 | 8/1998 |
| JP | 10-251633 | 9/1998 |
| JP | 10-265773 | 10/1998 |
| JP | 10-302960 | 11/1998 |

(Continued)

OTHER PUBLICATIONS

Chang et al., 3,4-Dinitro-N,N,N',N'-tetraphenylthiophene-2,5-diamine, 2005, Acta Crystallographica, Section E, E61(10): STN Abstract.*

(Continued)

*Primary Examiner* — Jennifer Chriss
*Assistant Examiner* — Gregory Clark
(74) *Attorney, Agent, or Firm* — K&L Gates LLP

(57) ABSTRACT

An organic electroluminescent is provided having an anode, a cathode, and at least one organic layer including a light-emitting layer provided between the anode and the cathode, wherein the organic layer includes an amine compound represented by the following formula (1):

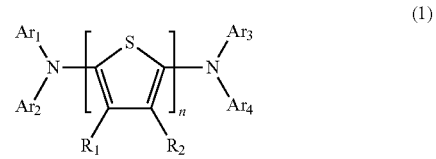

(1)

wherein $Ar_1$ to $Ar_4$ each independently represent a specific aromatic group; $R_1$ and $R_2$ each independently represent a hydrogen atom, a halogen atom or a particular substituent group; and n stands for an integer of 1, 2 or 3.

9 Claims, 5 Drawing Sheets

FOREIGN PATENT DOCUMENTS

| | | | |
|---|---|---|---|
| JP | 2000-256351 | | 9/2000 |
| JP | 2001-085713 | * | 3/2001 |
| JP | 2001-273978 | | 5/2001 |
| JP | 2001-345181 | | 12/2001 |
| JP | 2002-322173 | | 8/2002 |
| JP | 2003-13054 | | 1/2003 |
| JP | 2003-267973 | | 9/2003 |
| JP | 2006-206596 | | 8/2006 |
| JP | 04-304466 | | 8/2009 |
| WO | 2006-046441 | | 5/2006 |
| WO | 2008-023759 | | 2/2008 |

OTHER PUBLICATIONS

Japanese Office Action (JP2007-190985) dated Dec. 8, 2009.
Applied Physics Letters, 1994, 65, p. 807-809.
Applied Physics Letters, 1997, 70, p. 699-701.
Annual Reports Section "C" (Physical Chemistry), 20 03 99, p. 87-125.
Japanese Office Action issued on Jun. 23, 2009, for corresponding Japanese Patent Application JP 2007-190982.

* cited by examiner

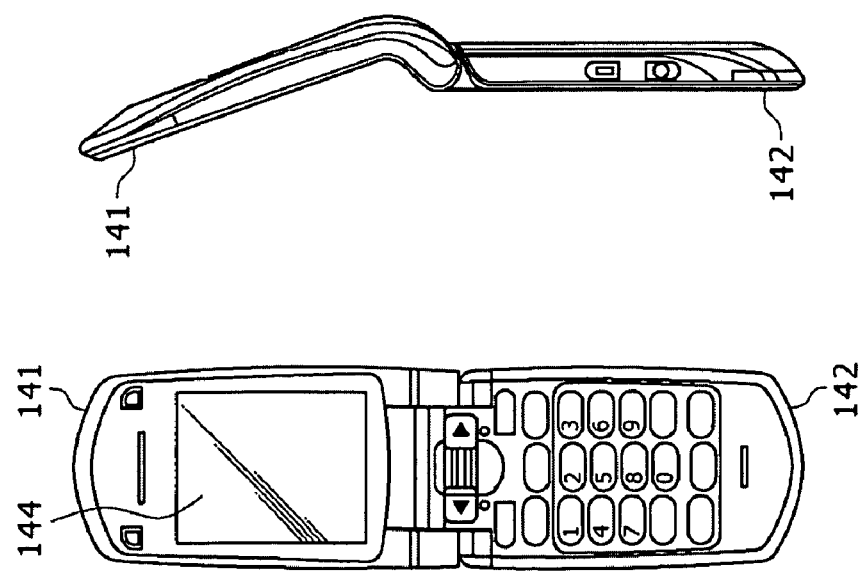
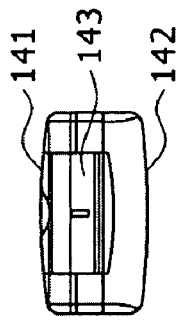
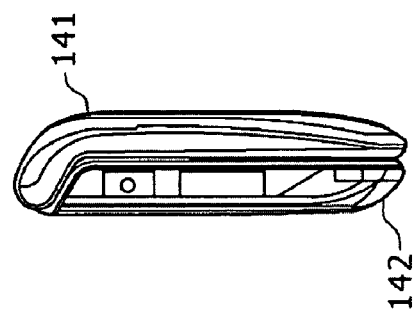
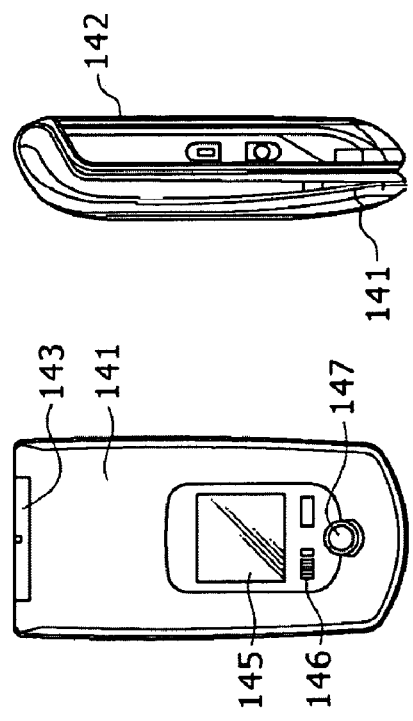
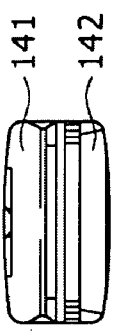
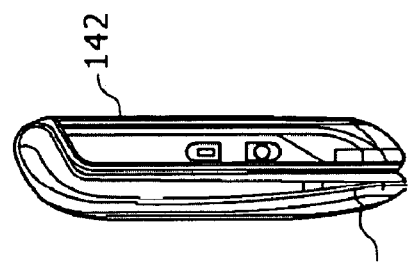

ORGANIC ELECTROLUMINESCENT DEVICE AND DISPLAY DEVICE

CROSS REFERENCES TO RELATED APPLICATIONS

The present application claims priority to Japanese Patent Application JP 2007-190982 filed in the Japan Patent Office on Jul. 23, 2007, Japanese Patent Application JP 2007-190985 filed in the Japan Patent Office on Jul. 23, 2007, and Japanese Patent Application JP 2007-190984 filed in the Japan Patent Office on Jul. 23, 2007, the entire contents of which being incorporated herein by reference.

BACKGROUND

The present application relates to an organic electroluminescent device making use of an amine compound suited as an organic material for organic electroluminescent devices, and also to a display device making use of one or more of such organic electroluminescent devices.

As self-emitting flat panel displays of low power consumption, high response speed and no viewing angle dependency, display devices making use of organic electroluminescent devices (so-called organic EL devices) have been drawing attention in recent years.

In general, an organic electroluminescent device is provided with an organic layer between an anode and a cathode, and emits light as a result of recombination of holes and electrons injected from the anode and cathode, respectively, in the organic layer. Developed as such organic layers include, for example, a construction that a hole transport layer, a light-emitting layer with an organic light-emitting material contained therein, and an electron transport layer are stacked one over another from the side of the anode, and a construction that a light-emitting material is included in an electron transport layer to form an electron-transporting, light-emitting layer.

Organic electroluminescent devices of such a construction are self-emitting devices. When constructing a display device by using these organic electroluminescent devices, it is, therefore, most important requirements to provide them with a longer service life and to ensure their reliability. Accordingly, research is now under way on organic materials that make up organic electroluminescent devices.

A hole transport layer assumes an important role to control the balance of recombination in a light-emitting layer, and in addition, is required to have a structure excellent in thermal stability. N,N'-diphenyl-N,N'-di(m-tolyl)benzidine (TPD), a representative material known as a hole transport material, has a low glass transition point (Tg) as its thermal property although it is a good hole transport material.

In recent years, there have been disclosed organic materials excellent in amorphousness owing to the introduction of the thiophene nucleus into the central skeletons of amine compounds (Japanese Patent Laid-Open No. Hei 10-219242 and Japanese Patent Laid-Open No. 2003-13054). Further, compounds, each of which contains amino groups around one thiophene skeleton via aryl groups interposed between the amino groups and the thiophene skeleton, are disclosed to function as hole injection materials (Japanese Patent Laid-Open No. 2001-345181 and Japanese Patent Laid-Open No. 2003-267973).

As a cause of a deterioration in brightness as a result of drive of an organic electroluminescent device, the crystallization of an organic material due to joule heat associated with the drive is considered to be attributable. As a method adopted to resolve this problem, the molecular weight is increased to heighten the amorphous properties. For example, 4,4',4"-tris (3-methylphenylphenylamino)triphenylamine (m-MTDATA) the molecular skeleton of which is of the starburst type is known as a material excellent in amorphousness (Applied Physics Letters (U.S.A.), 65, 807-809 (1994)). However, further improvements are still desired because the use of this m-MTDATA requires a high voltage.

As a method for allowing an organic electroluminescent device to operate at a lower voltage, it is necessary, to provide the organic electroluminescent device with increased charge transport ability. With an oligothiophene which is an oligomer of six or more thiophene units linked together, the organic electroluminescent device is known to exhibit good charge transport ability as an organic semiconductor (Japanese Patent Laid-Open No. 2002-322173). Concerning an amine compound with three thiophene units linked together as a compound having such property introduced therein, characteristics of an organic electroluminescent device are disclosed, but a high voltage is still required to obtain brightness (Applied Physics Letters (U.S.A.), 70, 699-701 (1997)).

SUMMARY

It has, therefore, been difficult to achieve the avoidance of crystallinity and a reduction in drive voltage together. It has also been unable to provide an organic electroluminescent device with a good brightness life while allowing it to retain a high efficiency.

There is a need to provide an organic electroluminescent device making use of an amine compound, which acts as an excellent electron transport material, and a display device making use of one or more of such organic electroluminescent devices.

To resolve the above-described problems, the present application provides, in a first embodiment thereof, an organic electroluminescent device provided with an anode, a cathode, and at least one organic layer including a light-emitting layer and held between the anode and the cathode, wherein the organic layer is formed with an amine compound represented by the following formula (1):

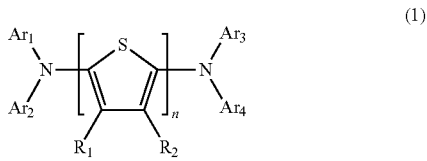

(1)

wherein $Ar_1$ to $Ar_4$ each independently represent a carbocyclic aromatic group having a total carbon number of from 6 to 20 or a heterocyclic aromatic group having a total carbon number of from 3 to 20; $R_1$ and $R_2$ each independently represent a hydrogen atom, a halogen atom, a hydroxyl group, a substituted or unsubstituted carbonyl group having a carbon number of from 1 to 20, a substituted or unsubstituted carbonyl ester group having a carbon number of from 1 to 20, a substituted or unsubstituted alkyl group having a carbon number of from 1 to 20, a substituted or unsubstituted alkenyl group having a carbon number of from 2 to 20, a substituted or unsubstituted alkoxyl group having a carbon number of from 1 to 20, a cyano group, a nitro group, a carbocyclic aromatic group having a total carbon number of from 6 to 20 or a heterocyclic aromatic group having a total carbon number of from 3 to 20; and n stands for an integer of 1, 2 or 3.

The amine compound may preferably be one of the formula (1) in which $Ar_1$ to $Ar_4$ are each independently selected from a substituted or unsubstituted phenyl, naphthyl, biphenyl, fluorenyl, anthryl, pyrenyl or fluoranthenyl group.

The amine compound may preferably be one of the formula (1) in which $R_1$ and $R_2$ are each a hydrogen atom and $Ar_1$ to $Ar_4$ are each independently selected from a phenyl, naphthyl or biphenyl group.

To resolve the above-described problems, the present application also provides, in a working example of the first embodiment thereof, any one of the above-described organic electroluminescent devices, wherein the organic layer has at least a light-emitting layer and a hole transport layer and the amine compound is used as a material forming the hole transport layer.

To resolve the above-described problems, the present application also provides, in another working example of the first embodiment thereof, any one of the above-described organic electroluminescent devices, wherein the organic layer has at least a light-emitting layer and a hole injection layer and the amine compound is used as a material forming the hole injection layer.

To resolve the above-described problems, the present application also provides, in a second embodiment thereof, a display device including a plurality of organic electroluminescent devices formed in an array on a substrate, each of the organic electroluminescent devices being provided with an anode, a cathode and at least one organic layer including a light-emitting layer provided between the anode and the cathode, wherein in at least one of the organic electroluminescent devices, the at least one organic layer includes an amine compound represented by the following formula (1):

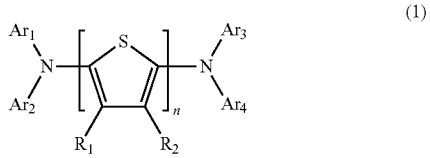

(1)

wherein $Ar_1$ to $Ar_4$ each independently represent a carbocyclic aromatic group having a total carbon number of from 6 to 20 or a heterocyclic aromatic group having a total carbon number of from 3 to 20; $R_1$ and $R_2$ each independently represent a hydrogen atom, a halogen atom, a hydroxyl group, a substituted or unsubstituted carbonyl group having a carbon number of from 1 to 20, a substituted or unsubstituted carbonyl ester group having a carbon number of from 1 to 20, a substituted or unsubstituted alkyl group having a carbon number of from 1 to 20, a substituted or unsubstituted alkenyl group having a carbon number of from 2 to 20, a substituted or unsubstituted alkoxyl group having a carbon number of from 1 to 20, a cyano group, a nitro group, a carbocyclic aromatic group having a total carbon number of from 6 to 20 or a heterocyclic aromatic group having a total carbon number of from 3 to 20; and n stands for an integer of 1, 2 or 3.

In the above-described display device, the at least one organic electroluminescent device in which the organic layer includes the amine compound may preferably be used as a common material for a blue-light emitting device, a green-light emitting device and a red-light emitting device to form a blue pixel, a green pixel and a red pixel, respectively.

Owing to the construction of the organic layer in the organic electroluminescent device according to working examples of the present application with the amine compound represented by the formula (1) as described above, the organic electroluminescent device can be driven at a low voltage while being provided with improved luminescence efficiency and emission life. Further, the display device making use of one or more of such organic electroluminescent devices, each containing the amine compound, can be driven at a low voltage, is excellent in power consumption, and enables a high-reliability, full color display.

Additional features and advantages are described herein, and will be apparent from the following Detailed Description and the figures.

BRIEF DESCRIPTION OF THE FIGURES

FIG. 8A is a front view of a cellular phone as one example of mobile terminal equipment, to which the working example of the present application can be applied, in an opened state, FIG. 8B is a side view of the cellular phone in the opened state, FIG. 8C is a front view of the cellular phone in a closed state, FIG. 8D is a left side view of the cellular phone in the closed state, FIG. 8E is a right side view of the cellular phone in the closed state, FIG. 8F is a top view of the cellular phone in the closed state, and FIG. 8G is a bottom view of the cellular phone in the closed state.

DETAILED DESCRIPTION

Figure 1:
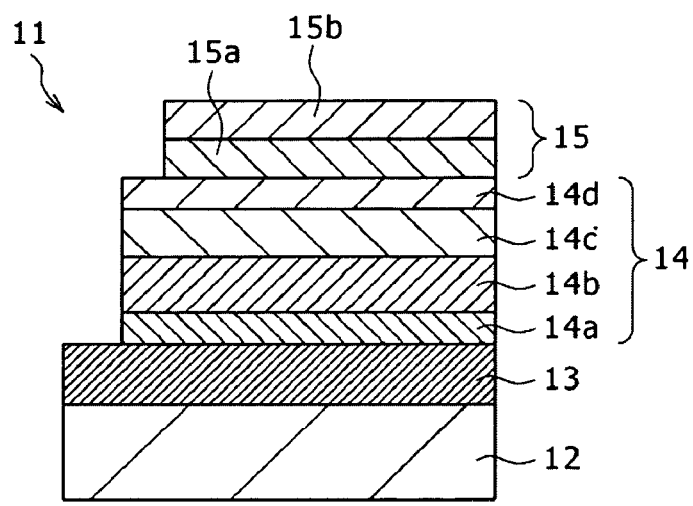
FIG. 1 is a cross-sectional view of an organic electroluminescent device according to a working example of the present application.

Working examples of the present application will hereinafter be described in the order of the amine compound, the organic electroluminescent device making use of the amine compound, and the display device according to embodiments. It is to be noted that, although the present application will be described based on the working examples shown in the drawings, the present application shall not be limited to the working examples and can be modified as needed depending on the mode of practice, and any mode of practice shall be embraced within the scope of the present application insofar as the advantageous effects of the present application are brought about.

In the organic electroluminescent device according to a working example, the amine compound represented by the below-described formula (1) is used. A description will now be made about specific examples.

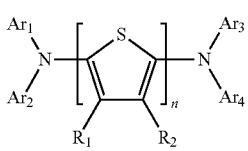

(1)

wherein $Ar_1$ to $Ar_4$ each independently represent a carbocyclic aromatic group having a total carbon number of from 6 to 20 or a heterocyclic aromatic group having a total carbon number of from 3 to 20; $R_1$ and $R_2$ each independently represent a hydrogen atom, a halogen atom, a hydroxyl group, a substituted or unsubstituted carbonyl group having a carbon number of from 1 to 20, a substituted or unsubstituted carbonyl ester group having a carbon number of from 1 to 20, a substituted or unsubstituted alkyl group having a carbon number of from 1 to 20, a substituted or unsubstituted alkenyl group having a carbon number of from 2 to 20, a substituted or unsubstituted alkoxyl group having a carbon number of from 1 to 20, a cyano group, a nitro group, a carbocyclic aromatic group having a total carbon number of from 6 to 20 or a heterocyclic aromatic group having a total carbon number of from 3 to 20; and n stands for an integer of 1, 2 or 3.

The amine compound represented by the formula (1) is an amine compound suitably usable in the organic layer of the organic electroluminescent device, and to a single thiophene unit or repeating thiophene units, amino groups each having carbocyclic and/or heterocyclic, aromatic groups are bonded.

Further, $Ar_1$ to $Ar_4$ in the formula (1) each independently represent a carbocyclic aromatic group having a total carbon number of from 6 to 20 or a heterocyclic aromatic group having a total carbon number of from 3 to 20, which may be substituted further by one or more other groups and may be unsubstituted.

The carbocyclic aromatic group, which may represent one or more of $Ar_1$ to $Ar_4$, may preferably be formed of 20 or fewer carbon atoms. Illustrative are phenyl, 1-naphthyl, 2-naphthyl, fluorenyl, 1-anthryl, 2-anthryl, 9-anthryl, 1-phenanthoryl, 2-phenanthoryl, 3-phenanthoryl, 4-phenanthoryl, 9-phenanthoryl, 1-naphthacenyl, 2-naphthacenyl, 9-naphthacenyl, 1-pyrenyl, 2-pyrenyl, 4-pyrenyl, 1-chrysenyl, 6-chrysenyl, 2-fluoranthenyl, 3-fluoranthenyl, 2-biphenylyl, 3-biphenylyl, 4-biphenylyl, o-tolyl, m-tolyl, p-tolyl, p-t-butylphenyl, etc. Among these, particularly preferred can be selected from a substituted or unsubstituted phenyl, naphtyl, fluorenyl, anthryl, biphenylyl or pyrenyl.

The heterocyclic aromatic group, which may represent one or more of $Ar_1$ to $Ar_4$, may preferably be formed of 20 or fewer carbon atoms. Illustrative are 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furl, 3-furyl, 2-benzofranyl, 3-benzofranyl, 4-benzofranyl, 5-benzofranyl, 6-benzofranyl, 7-benzofranyl, 1-isobenzofranyl, 3-isobenzofranyl, 4-isobenzofranyl, 5-isobenzofranyl, 6-isobenzofranyl, 7-isobenzofranyl, quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalynyl, 5-quinoxalynyl, 6-quinoxalynyl, 1-carbazolyl, 2-carbazolyl, 3-carbazolyl, 4-carbazolyl, 9-carbazolyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acridinyl, 2-acridinyl, 3-acridinyl, 4-acridinyl, 9-acridinyl, etc.

When convenience is taken into consideration upon synthesis of the amine compound of the formula (1), it is preferred that among $Ar_1$ to $Ar_4$, $Ar_1$ and $Ar_3$ are the same and $Ar_2$ and $Ar_4$ are the same.

On the other hand, $R_1$ and $R_2$ in the formula (1) each independently represent a hydrogen atom, a halogen atom, a hydroxyl group, a carbonyl group, a carbonyl ester group, an alkyl group, an alkenyl group, an alkoxyl group, a cyano group, a nitro group, an aryl group, or a heterocyclic group. Of these, the carbonyl, carbonyl ester, alkyl, alkenyl and alkoxyl groups have 20 or fewer carbon atoms, and may each be substituted by one or more other groups or may each be unsubstituted. Further, the aryl group and heterocyclic group each have 20 or fewer carbon atoms, and may each be substituted by one or more other groups or may each be unsubstituted.

Examples of the carbonyl group include an aldehyde group, a ketone group and a carboxyl groups. Examples of the alkyl groups include linear alkyl groups, branched linear alkyl groups, and cycloalkyl groups.

The above-described groups represented by $Ar_1$ to $Ar_4$ and further by $R_1$ and $R_2$ include those which may further contain one or more substituents. Illustrative of these substituents are halogen atoms, a hydroxyl group, a carbonyl group, carbonyl ester groups, cycloalkyl groups, alkenyl groups, alkoxyl groups, aryl groups, heterocyclic groups, a cyano group, a nitro group and a silyl group.

Particularly preferred in a working example of the present application are amine compounds of the formula (1) in which $R_1$ and $R_2$ are each a hydrogen atom and $Ar_1$ to $Ar_4$ are each selected from phenyl, naphthyl or biphenyl.

In Table 1 to Table 3 to be described below, illustrative structures of the above formula (1) (structural formulas (1) to (39)) will be shown. It is, however, to be noted that amine compounds useful in the present application are not limited to the exemplified structures insofar as the amine compounds are included in the above-mentioned range.

TABLE 1

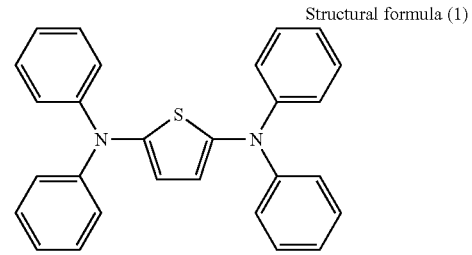

Structural formula (1)

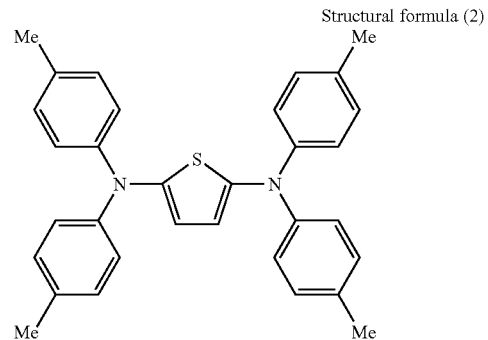

Structural formula (2)

TABLE 1-continued
Structural formula (3)
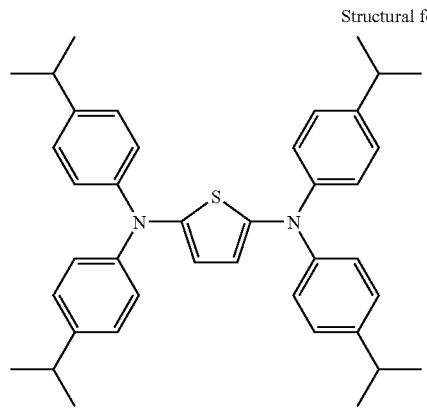
Structural formula (4)
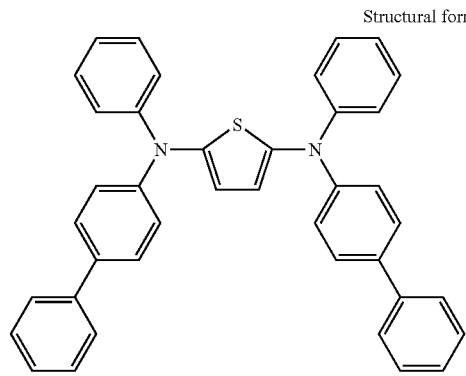
Structural formula (5)
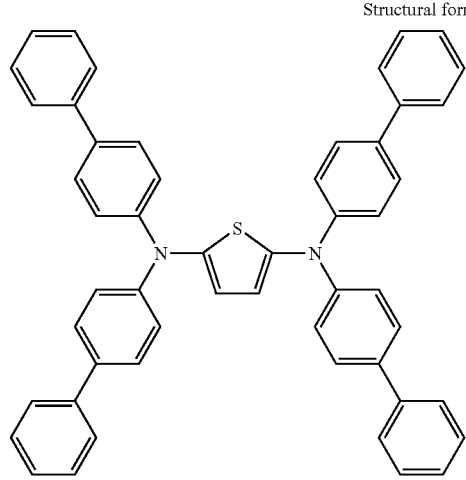
Structural formula (6)
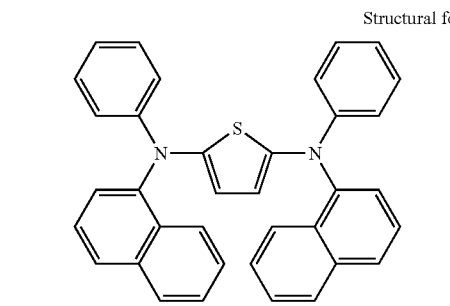
TABLE 1-continued
Structural formula (7)
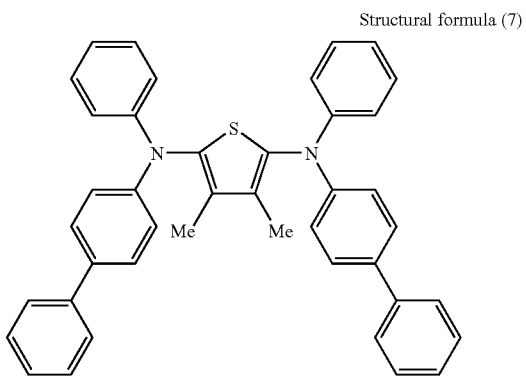
Structural formula (8)
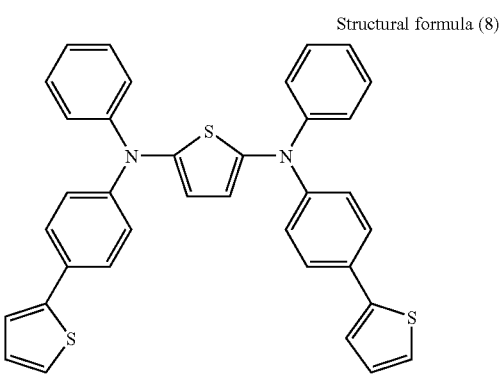
Structural formula (9)
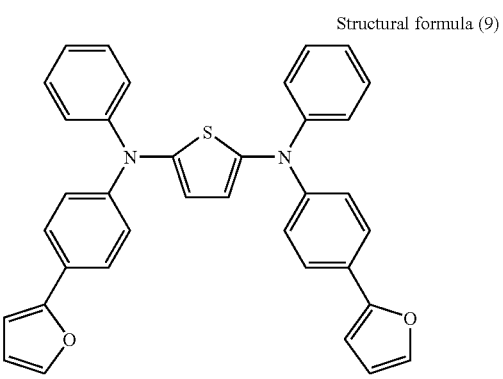
Structural formula (10)
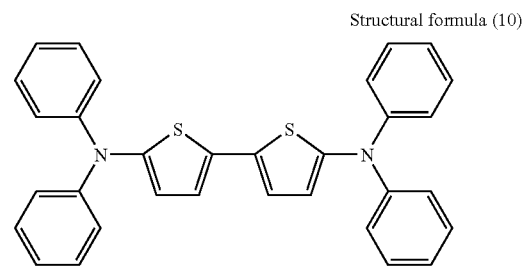

TABLE 1-continued
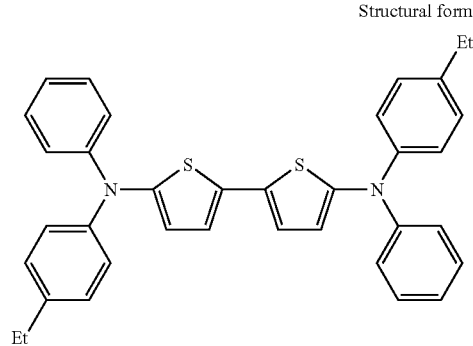
Structural formula (11)
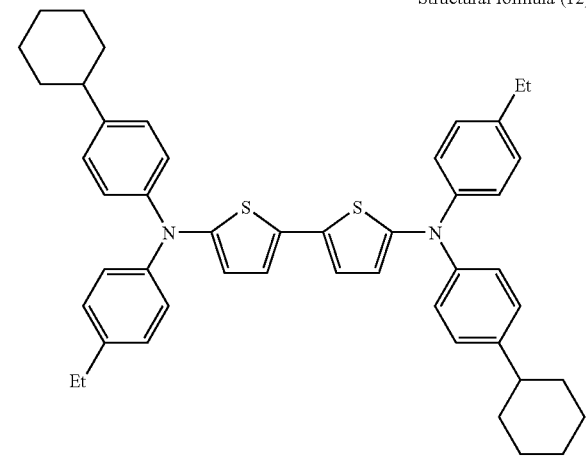
Structural formula (12)
TABLE 2
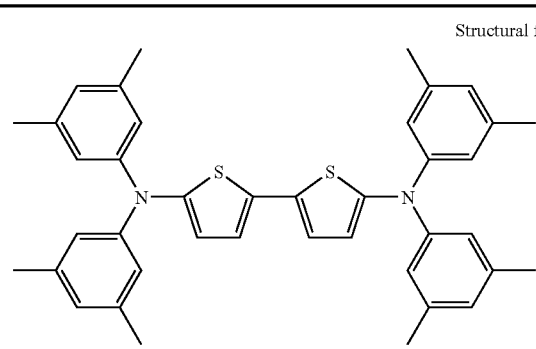
Structural formula (13)
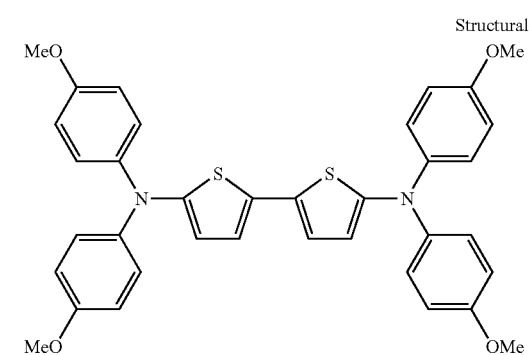
Structural formula (14)
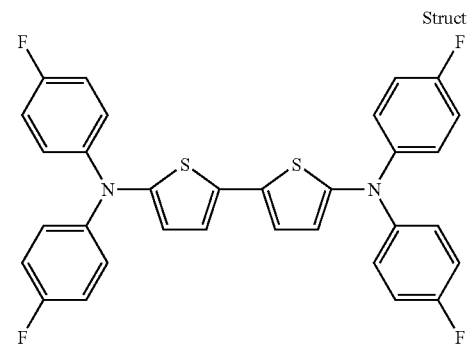
Structural formula (15)

TABLE 2-continued
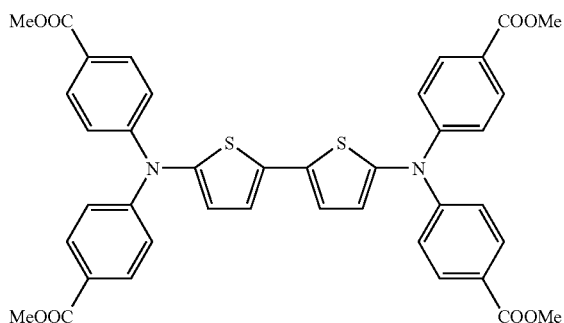
Structural formula (16)
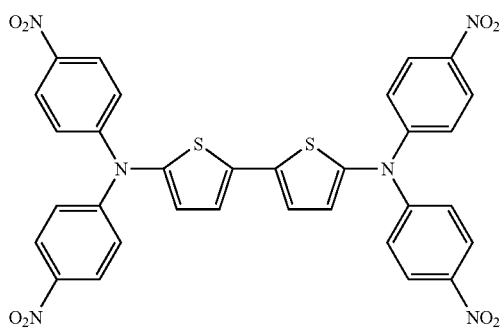
Structural formula (17)
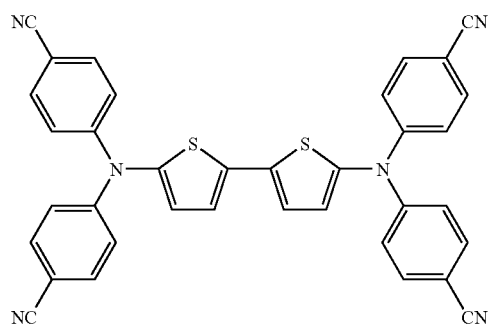
Structural formula (18)
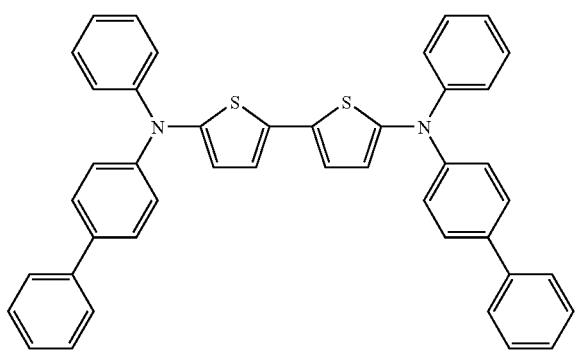
Structural formula (19)

TABLE 2-continued
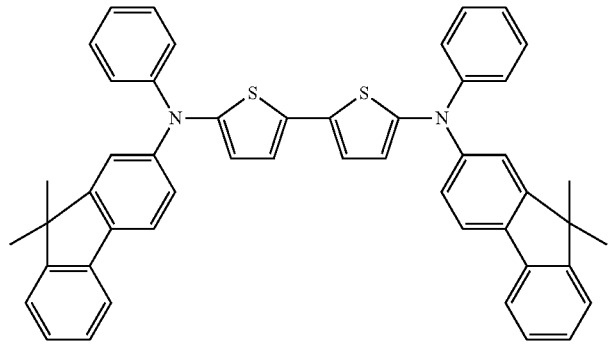
Structural formula (20)
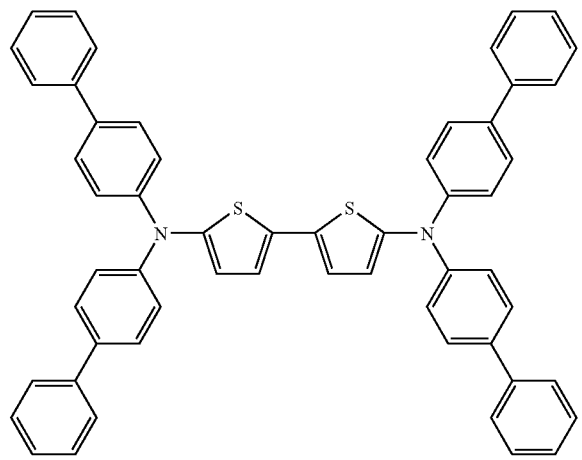
Structural formula (21)
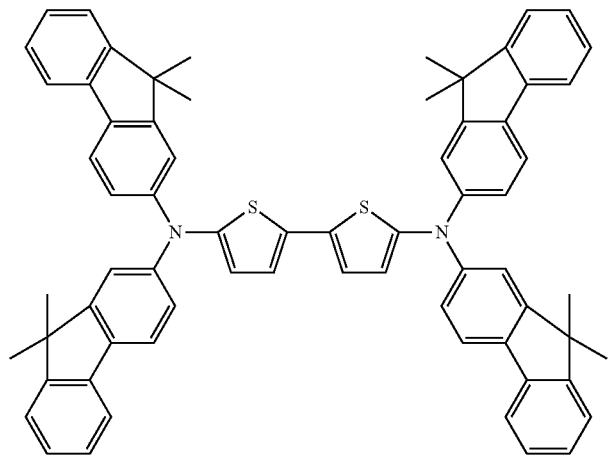
Structural formula (22)
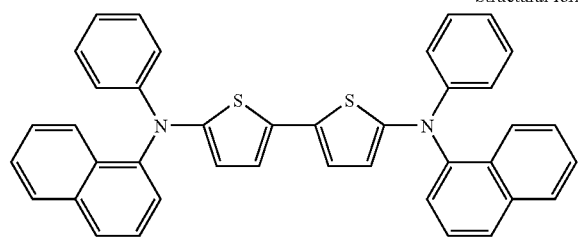
Structural formula (23)

TABLE 2-continued
Structural formula (24)
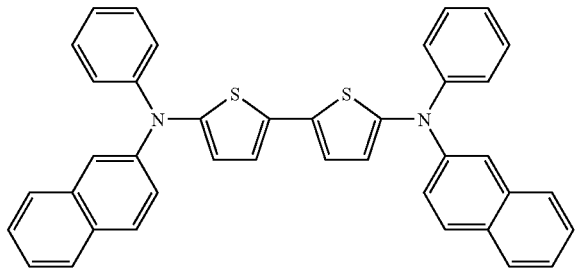
Structural formula (25)
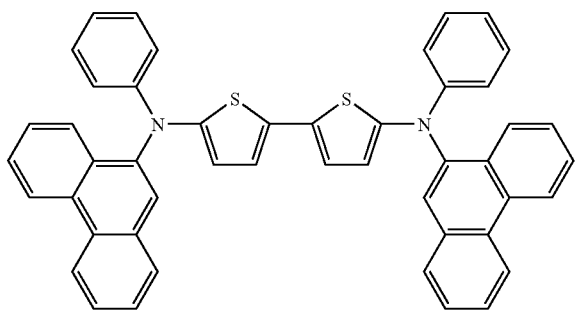
Structural formula (26)
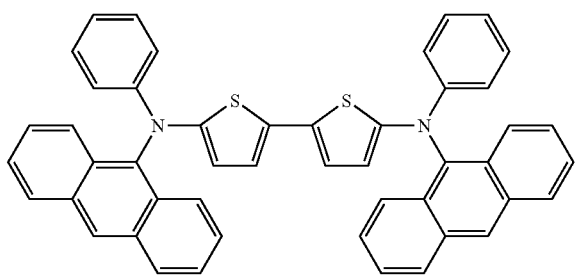
Structural formula (27)
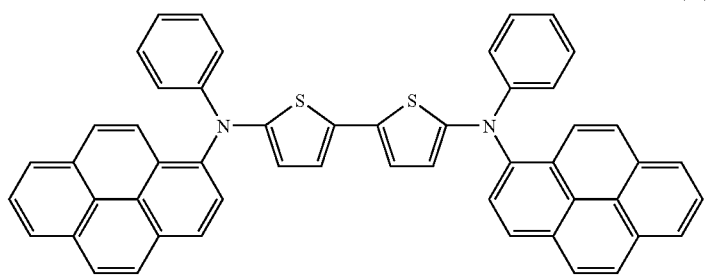

TABLE 3
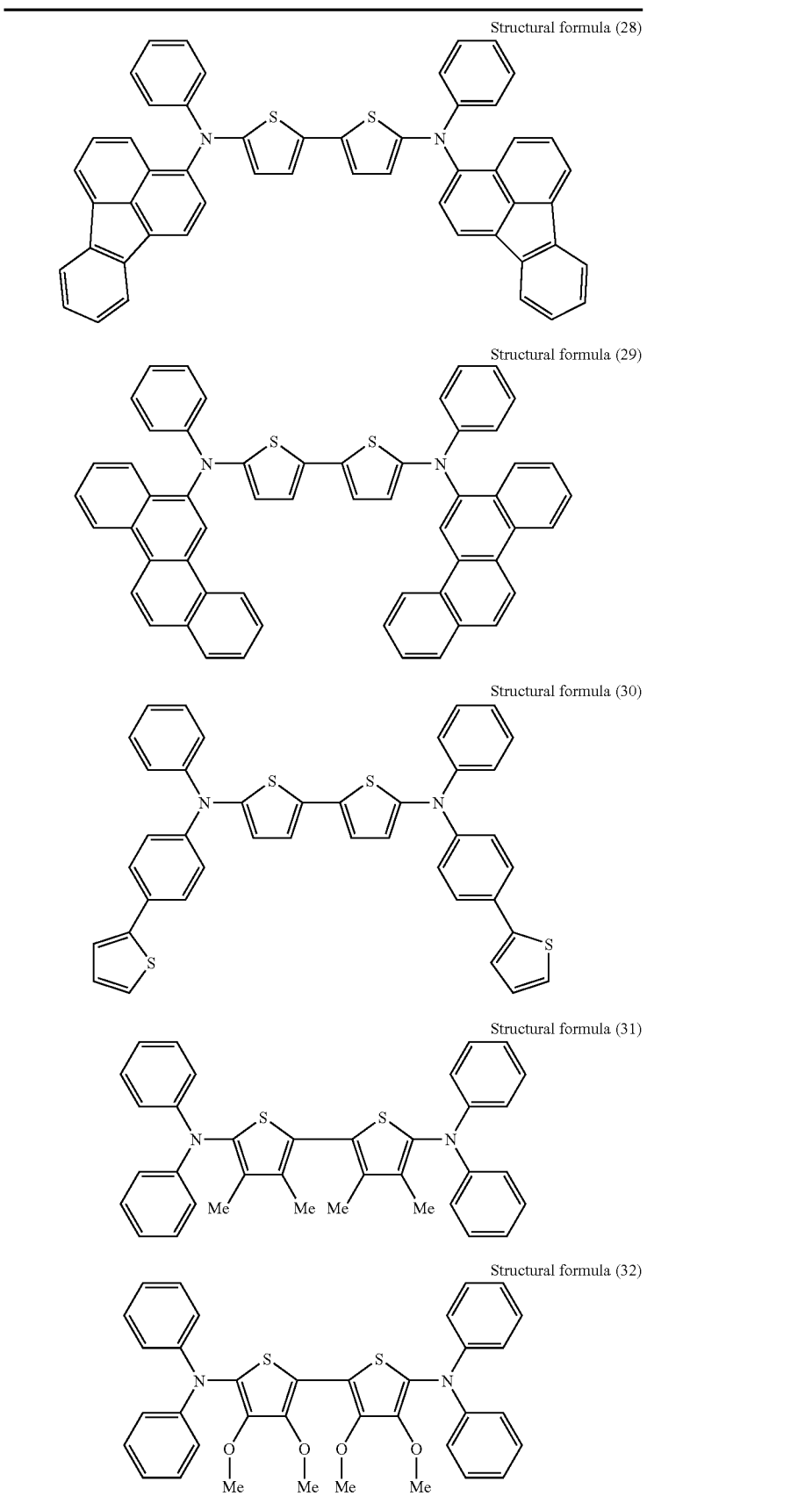

TABLE 3-continued
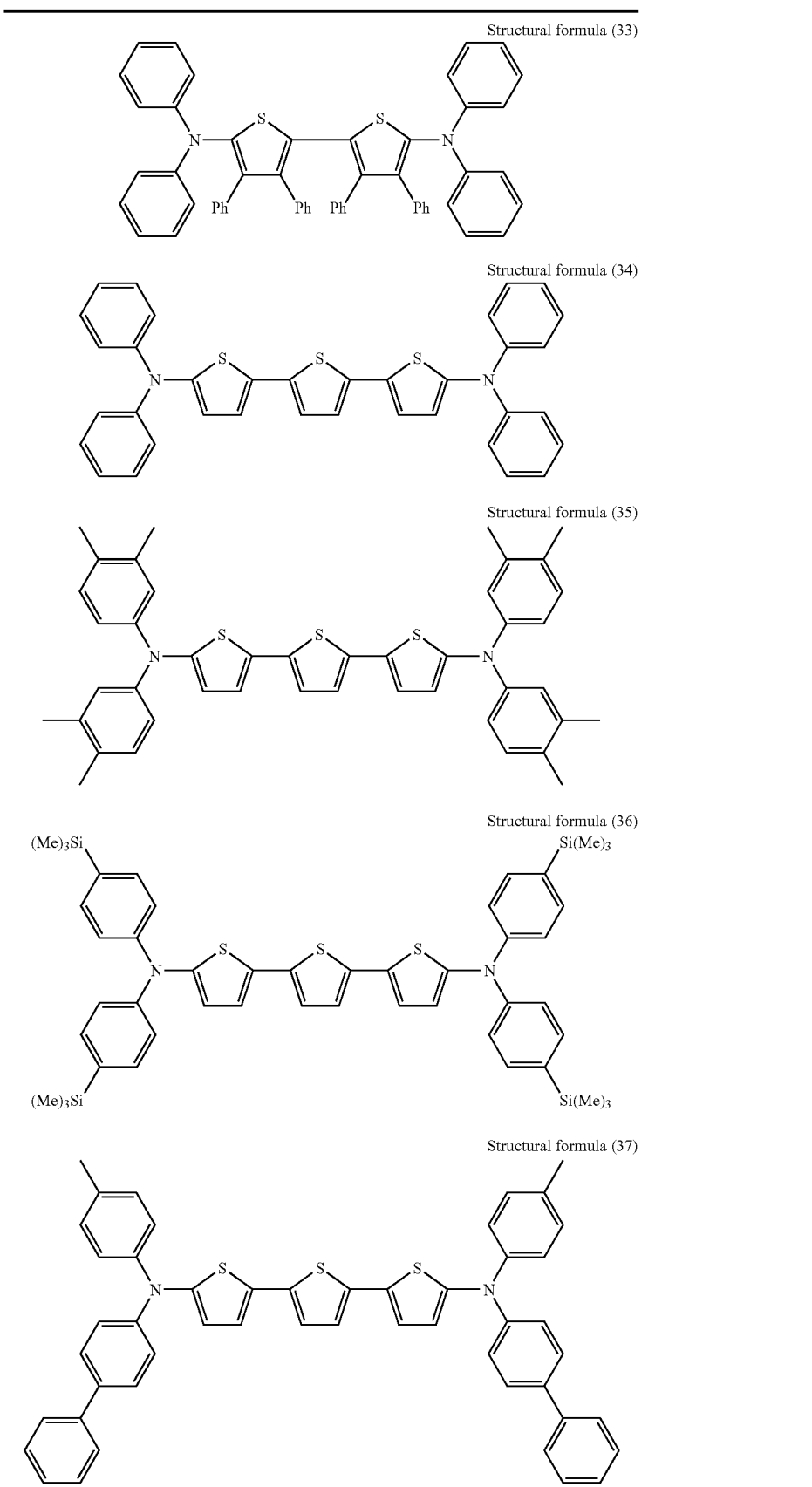

TABLE 3-continued

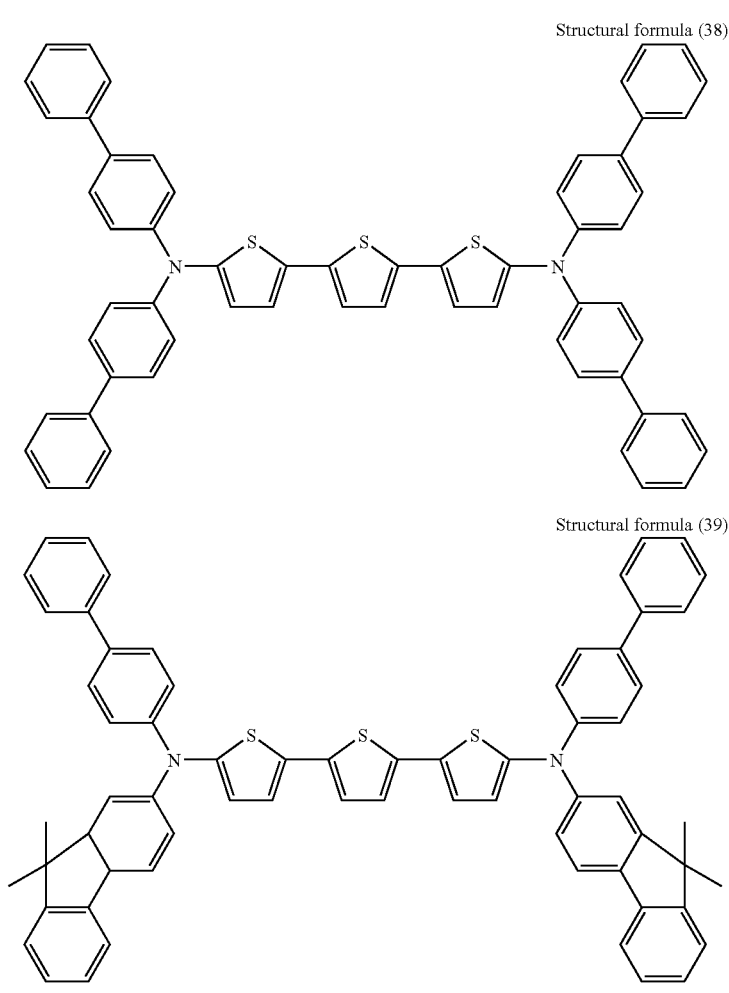

The above-exemplified amine compounds can be synthesized by various processes. For example, the following processes a) to c) can be mentioned.

a) A synthesis process that couples a halogenated thiophene by a Grignard reaction making use of magnesium.

b) A synthesis process that couples a halogenated thiophene by an Ullmann reaction in the presence of a copper catalyst.

c) A synthesis process that couples a thiophene boronic acid or boronate ester by a transition metal catalyst represented by palladium (so-called Suzuki coupling reaction).

The amine compound for use in a working example of the present application is employed as a material for forming an organic layer in an organic electroluminescent device. It is, therefore, preferred to increase its purity before providing it to the fabrication process of the organic electroluminescent device. The purity may, be increased preferably to 95% or higher, more preferably to 99% or higher. As methods for obtaining the amine compound at such a high purity, known high purification methods making use of sublimation purification or zone melting can be employed in addition to recrystallization, reprecipitation and silica or alumina column purification, all of which are purification methods applicable subsequent to the synthesis of the amine compound.

As an alternative, it is also possible to repeatedly perform such a purification method or to perform different purification methods in combination such that impurities, such as the unreacted reactants for the amine compound, reaction byproducts, catalyst residue and any remaining solvent, can be decreased to obtain an organic electroluminescent device of still better device characteristics.

By using one or more of the following storage methods d) to f) against external causes such as light and oxygen, the amine compound can be protected from deterioration reactions such as oxidation and decomposition. Such storage method shows effectiveness especially not only for providing an organic electroluminescent device, which is to be fabricated with the organic light-emitting material, with still better light-emitting characteristics but also for reducing a load to be imposed on a fabrication system.

d) The organic light-emitting material is promptly left standstill in a cold place after its synthesis. The storage temperature may range preferably from −100° C. to 100° C., more preferably from −50° C. to 50° C.

e) The organic light-emitting material is promptly stored in a container with light-shielding property after its synthesis.

f) Subsequent to the synthesis of the organic light-emitting material, the synthesized organic light-emitting material is stored under an inert gas atmosphere such as nitrogen, carbon dioxide or argon.

The amine compounds represented by the formula (1) and the structural formulas (1) to (39) as described above have a structure that two amino groups are bonded directly to one to three thiophene units in a central part. In other words, they are each formed of a single thiophene unit or linked two or three thiophene units and two specific arylamino groups or heteroarylamino groups bonded to the thiophene unit or units. Such an amine compound provides good light-emitting life especially in an organic electroluminescent device in which the amine compound is used as a hole transport material. This is considered to be attributable to the development of still better hole mobility by the thienyl-substituted TPD because a thienyl group is better in charge migration than a phenyl group. In other words, it is presumed that the increased hole mobility has resulted in a reduction in the voltage required for driving and hence in well balancing of excitonic recombination characteristics which in turn has led to the extension of the service life.

As a consequence, organic electroluminescent devices which will be described below and make use of these amine compounds as hole transport materials can be driven at low voltage, thereby assuring long light-emitting life. Moreover, their molecular weights are at such a level as assuring them to retain sufficient heat resistance, so that they are good in thermal properties, are excellent in the durability to external force and heat, and are also equipped with stability to voltage fluctuations.

Each of the above-described amine compounds can also be used as a material for forming a hole injection layer to be connected directly to an anode.

Depending on the selection of substituent groups, the amine compound for use in a working example of the present application can also be provided with electron transport ability and can also serve as a good chromophore. When formed as an organic layer in an organic electroluminescent device, the amine compound can, therefore, be used as a light-emitting layer which also serves as an electron transport layer or as a light-emitting layer which also serves as a hole transport layer. The amine compound for use in a working example of the present application can also be formed as a light-emitting layer held between an electron transport layer and a hole transport layer.

<<Organic Electroluminescent Device>>

FIG. 1 is a cross-sectional view schematically illustrating an organic electroluminescent device according to a working example of the present application. The organic electroluminescent device 11 illustrated in the figure is provided with an anode 13, an organic layer 14 and a cathode 15, all arranged in this order on a substrate 12. Among these, the organic layer 14 is formed, for example, of a hole injection layer 14a, a hole transport layer 14b, a light-emitting layer 14c and an electron transport layer 14d, all stacked in this order from the side of the anode 13.

Detailed constructions of the respective portions that make up the organic electroluminescent device 11 will next be described successively from the side of the substrate 12.

<Substrate>

The substrate 12 is a support, on the side of a principle surface of which organic electroluminescent devices 11 are formed in an array, and can be a known substrate. For example, a quartz plate, glass plate, metal foil, or resin film or sheet can be used. Of these, a quartz or glass plate is preferred. In the case of a resin film or sheet, its material can be a methacrylic resin led by polymethyl methacrylate (PMMA), a polyester such as polyethylene terephthalate (PET), polyethylene naphthalate (PEN) or polybutylene naphthalate (PBN), a polycarbonate, or the like. Further, the substrate may have a stacked structure with reduced water permeability or gas permeability or may be in a surface-treated form.

<Anode>

As the anode 13, electrode materials having a large work function from their vacuum levels to efficiently inject holes for example, metals such as aluminum (Al), chromium (Cr), molybdenum (Mo), tungsten (W), copper (Cu), silver (Ag) or gold (Au), their alloys, and oxides of these metals and alloys; and alloys of tin oxide ($SnO_2$) and antimony (Sb), alloys of ITO (indium titanium oxide), InZnO (indium zinc oxide) or zinc oxide (ZnO) with aluminum (Al), and oxides of these alloys; and the like can be used either singly or in combination.

The anode 13 can also have a stacked structure composed of a first layer excellent in light reflectivity and a second layer arranged over the first layer and having light transparency and a large work function.

The first layer is formed of an alloy which is composed of aluminum as a principal component. The alloy may contain, as its accessory component, at least one element the work function of which is smaller relative to aluminum as the principal component. As such accessory component or components, lanthanoid series elements are preferred. These lanthanoid series elements are not large in work function, but the inclusion of one or more of them provides the anode with improved stability and also with satisfactory hole injection ability. In addition to such lanthanoid series element or elements, elements such as silicon (Si) and copper (Cu) may also be contained as accessory components.

The content of such accessory component or components in the aluminum alloys layer as the first layer may preferably be about 10 wt % or lower in total, for example, when the accessory component or components are Nd capable of stabilizing aluminum, Ni, Ti and/or the like. Owing to the inclusion of such accessory component or components, the aluminum alloy layer can be kept stable during the fabrication process of the organic electroluminescent device and can also be provided with machining accuracy and chemical stability, while retaining the reflectivity of the aluminum alloy layer. The inclusion of such accessory component or components can also provide the anode with improved electrical conductivity and further with improved adhesion to the substrate 12.

As the second layer, on the other hand, a layer composed of at least one of oxides of an aluminum alloy, molybdenum oxides, zirconium oxides, chromium oxides and tantalum oxides can be exemplified. When the second layer is, for example, a layer of an oxide of an aluminum alloy containing a lanthanoid series element as an accessory component (including a natural oxidation film), the second layer including the lanthanoid series element is provided with good light transparency because the light transparency of the lanthanoid series element is high. As a consequence, high reflectivity can be maintained at the surfaces of the first layer. As an alternative the second layer can also be a transparent conductive layer of ITO (indium tin oxide), IZO (indium zinc oxide) or the like. These conductive layers can provide the anode 13 with improved electron injection characteristics.

The anode 13 may be provided, on a side where it is to be kept in contact with the substrate 12, with a conductive layer to improve the adhesion between the anode 13 and the substrate 12. As such a conductive layer, a transparent conductive layer of ITO, IZO or the like can be mentioned.

When the drive system of a display device fabricated using a plurality of such organic electroluminescent devices 11 is the active matrix system, anodes 13 are patterned corresponding to respective pixels and are arranged in such a state that they are connected to their associated, driving thin-layer transistors arranged on the substrate 12. In this case, the display device is constructed such that an insulating film, the illustration of which in the figure is omitted, is arranged over the anodes 13 and surfaces of the anodes 13 at the respective pixels are exposed through holes in the insulating film.

<Hole Injection Layer/Hole Transport Layer>

The hole injection layer 14a and hole transport layer 14b are each arranged to increase the hole injection efficiency into the light-emitting layer 14c. As materials for these hole injection layer 14a and hole transport layer 14b, usable examples include benzine, styrylamine, triphenylamine, porphyrin, triphenylene, azatriphenylene, tetracyanoquinodimethane, triazole, imidazole, oxadiazole, polyarylalkanes, phenylenediamine, arylamines, oxazole, anthracene, fluorenone, hydrazones, stilbene, and derivatives thereof; and cyclic conjugated monomers such as polysilane compounds, vinylcarbazole compounds, thiophene compounds and aniline compounds, and their oligomers and polymers.

More specific materials for the hole injection layer 14a and hole transport layer 14b include, but are not limited to, α-naphthylphenylphenylenediamine, porphyrin, metal tetraphenylporphyrins, metal naphthalocyanines, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano4,4,4-tris(3-methylphenylphenylamino)triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(paraphenylenevinylene), poly(thiophenevinylene), poly(2,2'-thienylpyrrole), and the like.

In this working example, an amine compound represented by the formula (1), specifically, desired one of the amine compounds represented by the structural formulas (1) to (39) is supposed to be contained in the hole injection layer 14a or hole transport layer 14b. Further, these amine compounds may be used singly or may be mixed with one or more other hole transport materials.

<Light-Emitting Layer>

The light-emitting layer 14c is a region, where upon application of a voltage across the anode 13 and the cathode 15, holes and electrons are injected from the anode 13 and cathode 15, respectively, and are then allowed to recombine with each other. The light-emitting layer 14c is formed using a material having a high light-emitting efficiency, for example, an organic light-emitting material, for example, such as a low-molecular fluorescent dye, a fluorescent high-molecular substance or a metal complex.

Materials for the light-emitting layer include aromatic hydrocarbon compounds, which are each composed of the phenylene nucleus, naphthalene nucleus, anthracene nucleus, pyrene nucleus, naphthacene nucleus, chrysene nucleus or perylene nucleus. Specifically, 9,10-diphenylanthracene, 9,10-di(1-naphthyl)anthracene, 9,10-di(2-naphthyl)anthracene, 1,6-diphenylpyrene, 1,6-di(1-naphthyl)pyrene, 1,6-di(2-naphthyl), 1,8-diphenylpyrene, 1,8-di(1-naphthyl)pyrene, 1,8-di(2-naphthyl)pyrene, rubrene, 6,12-diphenylchrysene, 6,12-di(1-naphthyl)chrysene, and 6,12-di(2-naphthyl)chrysene can be used suitably.

To the light-emitting layer 14c, another guest material may be added in a trace amount to control the spectrum of an emission in the light-emitting layer 14c. Employable as such other guest materials include organic materials such as naphthalene derivatives, amine compounds, pyrene derivatives, naphthacene derivatives, perylene derivatives, coumarin derivatives, and pyran dyes. Among these, their aromatic tertiary amine compounds can be used suitably.

It is to be noted that depending on the selection of substituent groups, the amine compound specified in the working example of the present application can also serve as a good light-emitting dye although it is a hole transport material. When the light-emitting layer 14c is formed using the amine compound specified in the working example of the present application, the amine compound may be used as a single constituent. The amine compound specified in the working example of the present application may be used as a guest material. In this case, it is preferred to use, as a host material, an aromatic hydrocarbon compound composed of the phenylene nucleus, naphthalene nucleus, anthracene nucleus, pyrene nucleus, naphthacene nucleus, chrysene nucleus or perylene nucleus.

The amine compound specified in the working example of the present application may also be used as a host material. In this case, the light-emitting layer 14c is formed using, as a guest material, a material having high light-emitting efficiency, for example, an organic light-emitting material such as a low-molecular fluorescent dye, a fluorescent high-molecular substance or a metal complex.

Examples of the light-emitting guest material when the amine compound specified in the working example of the present application is used as a host material include anthracene, naphthalene, indene, phenanthrene, pyrene, naphthacene, triphenylene, perylene, picene, fluoranthene, acetophenanthrylene, pentaphene, pentacene, coronene, butadiene, coumarin, acridine, stilbene, and derivatives thereof; tris(8-quinolinolato)aluminum complex, bis(benzoquinolinolato)beryllium complex, and tri(dibenzoylmethyl)phenanthroline europium complex; and ditoluylvinylbiphenyl.

<Electron Transport Layer>

The electron transport layer 14d is arranged to transport electrons, which have been injected from the cathode 15, to the light-emitting layer 14c. Materials for the electron transport layer 14d include, for example, quinoline, perylene, bisstyryl, pyrazine, triazole, oxazole, oxadiazole, fluorenone, and derivatives thereof. Specific examples include tris(8-hydroxyquinoline)aluminum (called "Alq3" for the sake of brevity), anthracene, naphthalene, phenanthrene, pyrene, perylene, butadiene, coumarin, acridine, stilbene, and derivatives thereof.

The individual layers 14a to 14d, which make up the organic layer 14, can be formed by a method, for example, such as vacuum evaporation or spin coating. Especially when another guest material is added in a trace amount in addition to the amine compound specified in the working example of the present application to control the spectrum of an emission in the light-emitting layer 14c, codeposition of the another guest material is performed upon formation of the light-emitting layer 14c.

It is to be noted that the organic layer 14 is not limited to such a layered structure. The organic layer 14 may be of such a construction as having, together with the light-emitting layer 14c, at least the hole injection layer 14a or hole transport layer 14b between the anode 13 and the light-emitting layer 14c, or of such a construction that the light-emitting layer 14c is arranged as a hole-transporting and light-emitting layer, an electron-transporting and light-emitting layer, or a light-emitting layer having bipolar charge transport ability.

Further, the individual layers which make up the above-described organic layer 14, for example; the hole injection layer 14a, hole transport layer 14b, light-emitting layer 14c and electron transport layer 14d may each have a stacked structure composed of plural layers.

<Cathode>

The cathode 15 is formed, for example, as a double-layered structure with a first layer 15a and a second layer 15b stacked in this order from the side of the organic layer 14.

The first layer 15a is formed with a material having a small work function and good light transparency. As such a material, lithium oxide ($Li_2O$) as an oxide of lithium (Li), cesium oxide ($Cs_2O$) as an oxide of cesium (Cs), or a mixture of these oxides can be used. Further, the first layer 15a is not limited to the use of such a material, and a metal having a small work function such as an alkaline earth metal such as calcium (Ca) or barium (Ba), an alkali metal such as lithium or cesium, indium (In) or magnesium (Mg) or an oxide or the like of such a metal may also be used alone or in a form of a mixture or alloy of two or more of these metals and oxides such that the first layer 15a can be provided with increased stability.

The second layer 15b is formed, for example, of a thin film making use of a material having light transparency such as MgAg. As an alternative, this second layer 15b may also be a mixed layer additionally containing an organic light-emitting material such as an aluminum-quinoline complex, styrylamine derivative or phthalocyanine derivative. In this case, the cathode 15 may additionally have, as a third layer, a layer having light transparency such as an MgAg layer.

The individual layers, which make up the cathode 15, can each be formed by a process such as vacuum evaporation, sputtering or plasma CVD (Chemical Vapor Deposition). When the drive system of a display device fabricated with such organic electroluminescent devices 11 is the active matrix system, the cathode 15 may be formed as a solid film on the substrate 12 such that the cathode 15 is insulated from the anode 13 by the organic layer 14 and the above-mentioned insulating film an illustration of which is omitted in the figure, and the cathode 15 is used as a common electrode to the respective pixels.

It is to be noted that the cathode 15 is not limited to such a stacked structure as described above. Needless to say, the cathode 15 can take a stacked structure of an optimal combination of layers depending on the construction of a device to be fabricated. For example, the cathode 15 in this working example is constructed in the stacked structure that the individual layers of the electrode are separated in function, specifically that the inorganic layer (the first layer 15a) for promoting the injection of electrons into the organic layer 14 and the inorganic layer (the second layer 15b) for serving as an electrode are separated from each other. However, the inorganic layer that promotes the injection of electrons into the organic layer 14 may also act as the inorganic layer that serves as the electrode or these layers may be formed as a single-layered structure. Further, the cathode 15 may also have a stacked structure with a transparent electrode of ITO or the like formed on the single-layered structure.

A current to be applied to the organic electroluminescent device 11 of the above-described construction is generally a direct current. As an alternative, a pulse current or an alternating current may also be used. No particular limitation is imposed on the current value and voltage value insofar as they fall within such ranges that the device is not broken. When the power consumption and service life of the organic electroluminescent device are taken into consideration, however, it is desired to make the organic electroluminescent device emit light efficiently with as small electric energy as possible.

The organic electroluminescent device 11 depicted in FIG. 1 may be of such a construction that a transparent electrode made of ITO or the like is used as the anode 13 and light is outputted from both upper and lower sides.

When the organic electroluminescent device 11 has a cavity structure, the total thickness of the organic layer 14 and the electrode made of a transparent material or semi-transparent material (the cathode 15 in this working example) is specified by the wavelength of an emission and is set at a value derived from a calculation of multiple interaction. When a display device making use of such organic electroluminescent devices 11 is of the so-called TAC (Top Emitting Adoptive Current Drive) structure that top-emitting organic electroluminescent devices are arranged on a substrate carrying TFTs formed thereon, the positive use of the cavity structure makes it possible to improve the light outputting efficiency to the outside and also to control the spectrum of an emission.

In the above-described organic electroluminescent device 11, the hole injection layer 14a or hole transport layer 14b in the organic layer 14 was formed using the amine compound described with reference to the formula (1). This construction has made it possible to improve the durability and stability of the organic layer 14 and also to obtain an improvement in mobility on the basis of the thiophene nucleus. As a result, it is possible to obtain an organic electroluminescent device, which as will be described in the below-described Examples, can be driven at a lower voltage, is high in emission efficiency and is excellent in service life.

In the above working example, the description was made solely of the use of the above-mentioned amine compound as a constituent material of the hole injection layer 14a or hole transport layer 14b. However, the anine compound for use in the present application is excellent in durability as mentioned in connection with the examples of the amine compound, and has electron transport ability and hole transport ability because it is an amine compound. The above-described amine compound can, therefore, be used as a material for forming layers other than the hole injection layer 14a or hole transport layer 14b, for example, the light-emitting layer 14c and electron transport layer 14d, thereby making it possible to provide these layers with improved durability.

Applications as described herein according to the embodiment are not limited only to top-emitting organic electroluminescent devices, that is, to TAC structures making use of such top-emitting electroluminescent devices. The present application is applicable widely to constructions in each of which an organic layer including at least a light-emitting layer is held between an anode and a cathode. The present application can, therefore, be applied to a constructions that a cathode, an organic layer and an anode are stacked in this order from the side of a substrate and also to a so-called bottom-emitting organic electroluminescent device that light is outputted only from the side of a lower electrode by forming an electrode, which is located on the side of a substrate (the lower electrode as a cathode or anode), with a transparent material and also forming, an electrode located on a side opposite to the substrate (an upper electrode as an anode or cathode), with a reflecting material. Even with these constructions, the use of the organic light-emitting material described with reference to the formula (1) in organic layers can bring about similar advantageous effects.

Further, the organic electroluminescent device according to the working example of the present application can be any organic electroluminescent device insofar as it is formed of a combination of electrodes (anode and cathode) and an organic layer held between the electrodes. Accordingly, the organic electroluminescent device according to the working example of the present application is not limited to one constructed only of a combination of electrodes and an organic layer, and does not exclude the additional inclusion of one or more other elements (for example, an inorganic compound layer and/or one or more inorganic components).

<<Display Device>>

Figure 2:
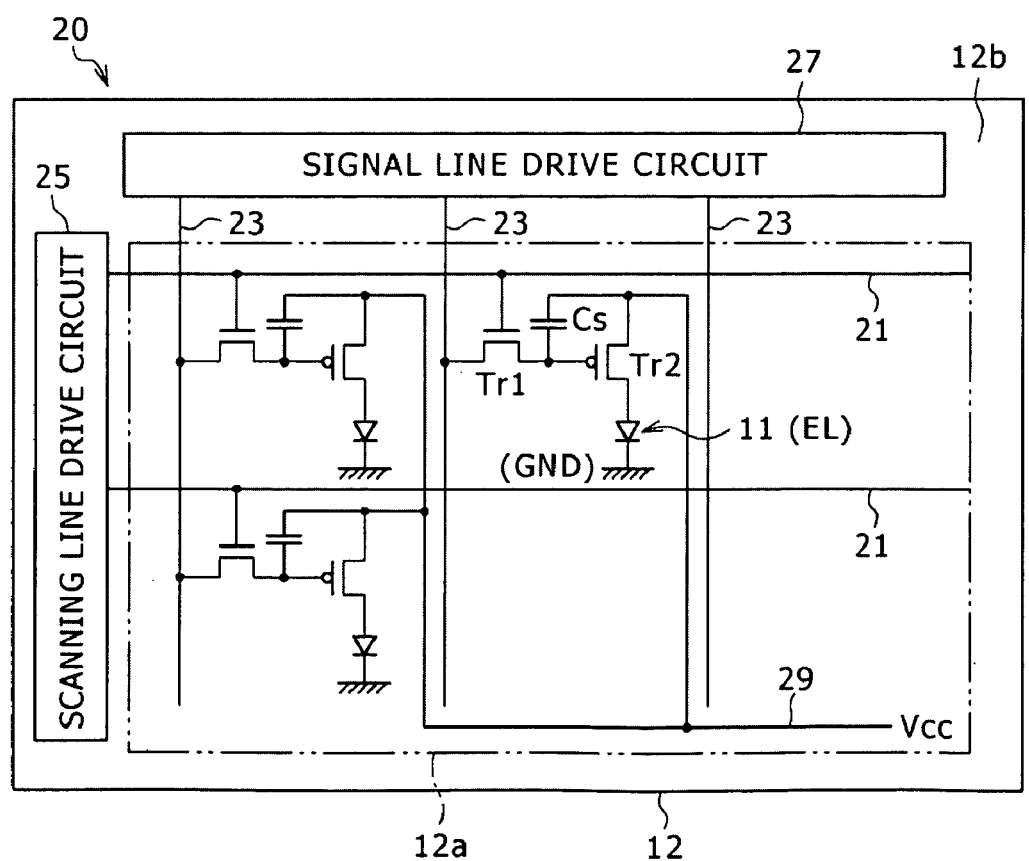
FIG. 2 is a circuit construction diagram of a display device according to another working example of the present application.

FIG. 2 is a schematic circuit construction diagram for describing one construction example of a display device making use of organic electroluminescent devices as described above, that is, a so-called organic EL display device. A description will hereinafter be made of a display device 20 of the active matrix system according to one working example of the second embodiment of the present application, which makes use of organic electroluminescent devices 11 according to the first working example.

As illustrated in the figure, a display area 12a and its peripheral area 12b are set on the substrate 12 of the display device 20. In the displays area 12a, plural scanning lines 21 and plural signal lines 23 are formed horizontally and vertically, respectively, and corresponding to their intersections, pixels are arranged, respectively, so that the display area 12a is constructed as a pixel array area. Arranged in the peripheral area 12b, on the other hand, are a scanning line drive circuit 25 for scanning and driving the scanning lines 21 and a signal line drive circuit 27 for feeding video signals (in other words, input signals) to the signal line 23 in correspondence to brightness information.

The pixel circuits arranged at the respective intersections between the scanning lines 21 and the signal lines 23 are each composed, for example, of a switching thin-film transistor Tr1, a driving thin-film transistor Tr2, a retention capacitor Cs, and the organic electroluminescent device 11. Each video signal, which has been written from the signal line 23 via the switching thin-film transistor Tr1 based on a drive by the scanning line drive circuit 25, is retained in the retention capacitor Cs, a current corresponding to the retained signal intensity is fed from the driving thin-film transistor Tr2 to the organic electroluminescent device 11, and the organic electroluminescent device 11 emits light at a brightness corresponding to the value of the current. It is to be noted that the driving thin-film transistor Tr2 and the retention capacitor Cs are connected to a common power supply line (Vcc) 29.

It is also to be noted that the above-described pixel circuit construction is merely illustrative. It is, therefore, possible to arrange a capacitor in the pixel circuit as needed, and to construct the pixel circuit with plural transistors. Further, one or more drive circuits can be added further to the peripheral area 12b as needed depending on modifications to the pixel circuit.

In the display device 20 according to the working example, three organic electroluminescent devices 11 of the first working example, which were described with reference to FIG. 1, are arranged as red (R), green (G) and blue (B) organic electroluminescent devices, respectively, at each of the intersections between the scanning lines 21 and signal lines 23, and by using these three organic electroluminescent devices of the respective colors as subpixels, one pixel is constructed. By arraying the respective pixels, each being formed of the subpixels of the three colors in combination, on the substrate 12, the display device 20 is constructed to perform full-color displays.

In the display device 20 equipped with the organic electroluminescent devices 11 of the above-described construction, it is desired to apply a measure such as the formation of a sealing film to avoid a deterioration of the organic electroluminescent devices 11 by water, oxygen and the like in the air.

Figure 3:
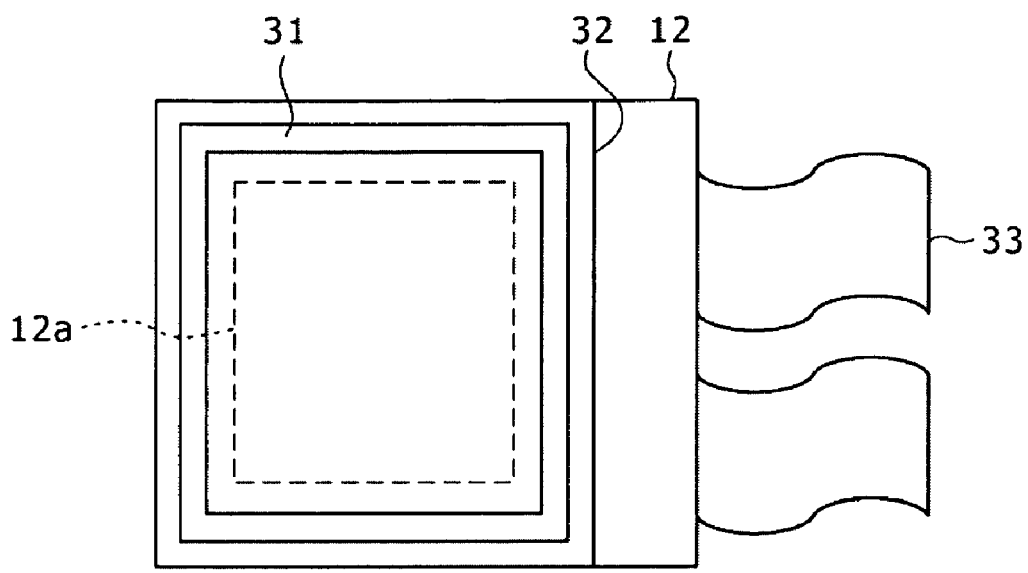
FIG. 3 is a construction diagram depicting a modularized display device of a sealed construction, to which a working example of the present application can be applied.

The display device according to the second working example can also be in the form of a module of sealed construction as shown in FIG. 3. For example, a sealing part 31 is arranged such that it surrounds the display area 12a as the pixel array area. Forming this sealing part 31 with an adhesive, the substrate 12 is bonded on an opposing element (sealing substrate 32) made of transparent glass or the like to fabricate a display module. This transparent sealing substrate 32 may be provided with a color filter, a protective film, a light-shielding film and/or the like.

The substrate 12 as a display, module with the display, area 12a formed thereon as described above may be provided with flexible printed substrates 33 for inputting/outputting signals or the like to the display area 12a (pixel arrays area) from the outside.

In the display device 20 of the above-described construction, the organic electroluminescent devices which make up the display device as described above are high in light-emitting efficiency and also excellent in service life characteristics. The combination of the organic electroluminescent devices as blue-, green- and red-emitting organic electroluminescent devices, therefore, makes it possible to perform full-color displays with high color reproducibility and reliability.

APPLICATION EXAMPLES

The above-described display device according to the working example of the present application can be applied as a display device in electronic equipment in various fields which displays, as a picture image or video image, video signals inputted in the electronic equipment or video signals generated in the electronic equipment, such as various electronic equipment depicted in FIGS. 4 to 8G, for example, digital cameras, notebook-size personal computers, mobile terminal equipment such as cellular phones, and video cameras. A description will hereinafter be made about examples of the electronic equipment to which the present application can be applied.

Figure 4:
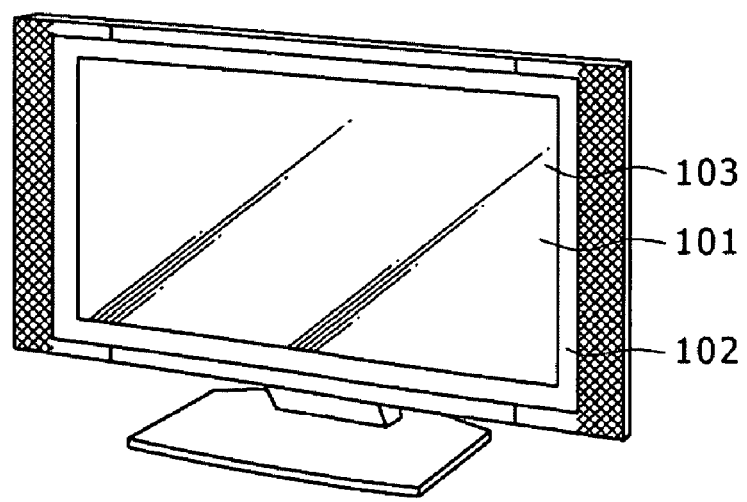
FIG. 4 is a perspective view showing a television set to which the working example of the present application can be applied.

FIG. 4 is a perspective view of a television set to which the present application can be applied. The television set according to this application example includes an image display screen 101 constructed of a front panel 102, a filter glass 103, etc., and can be manufactured by using the display device according to an embodiment as the image display screen 101.

Figure 5A:
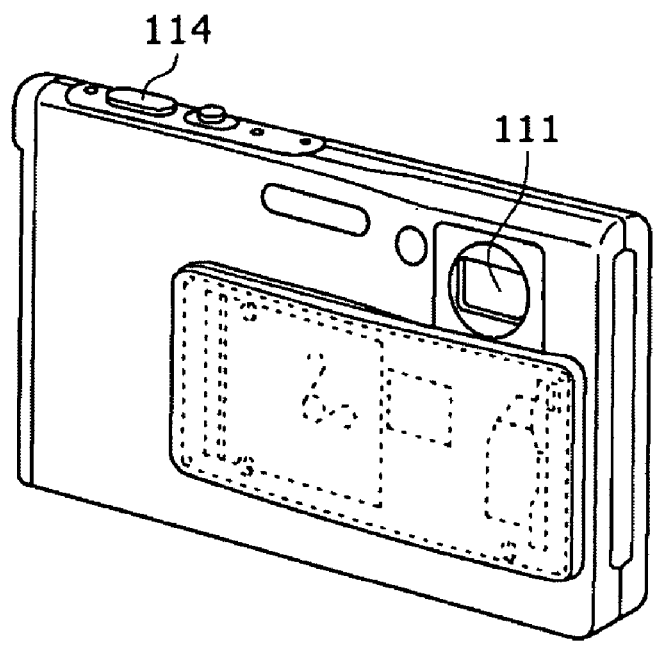
FIG. 5A is a perspective view illustrating a digital camera, to which the working example of the present application can be applied, as viewed from a front side.
Figure 5B:
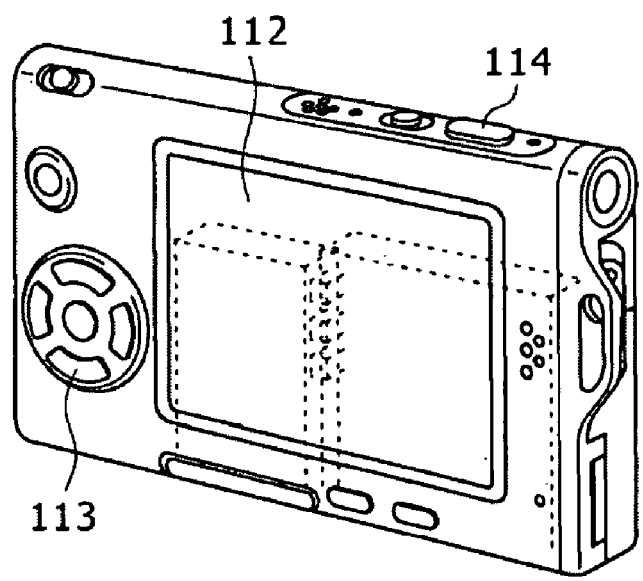
FIG. 5B is a perspective view of the digital camera as viewed from a back side.

FIGS. 5A and 5B are perspective, views of a digital camera to which the present application can be applied. FIG. 5A is a perspective view as viewed from the front side, while FIG. 5B is a perspective view as viewed from the back side. The digital camera according to this application example includes a light-emitting unit 111 for flash light, a display 112, a menu selector 113, a shutter button 114, etc., and can be manufactured by using the display device according as the display 112.

Figure 6:
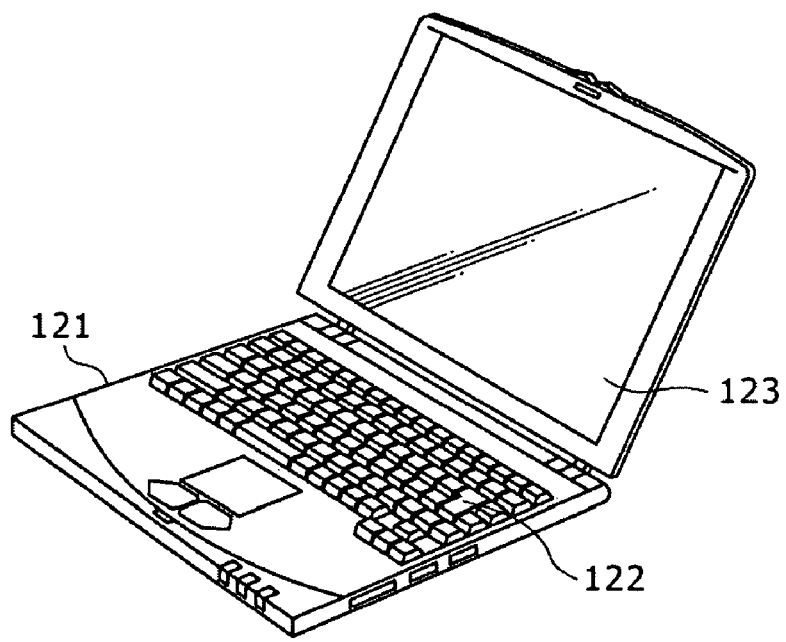
FIG. 6 is a perspective view depicting a notebook-size personal computer to which the working example of the present application can be applied.

FIG. 6 is a perspective view showing a notebook-size personal computer to which the present application can be applied. The notebook-size personal computer according to this application example includes a main body 121, a keyboard 122 to be operated upon inputting characters and the like, a display 123 for displaying images, etc., and can be manufactured by using the display device according to as the displays 123.

Figure 7:
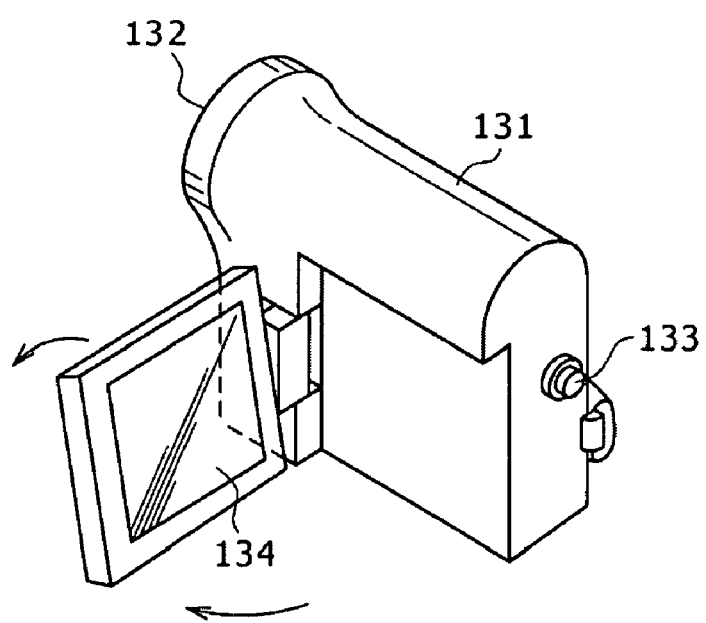
FIG. 7 is a perspective view depicting a video camera to which the working example of the present application can be applied.

FIG. 7 is a perspective view showing a video camera to which the present application can be applied. The video camera according to this application example includes a main body 131, an object-shooting lens 132 in a front side, a start/stop switch 133 employed upon shooting, a display 134, etc., and can be manufactured by using the display device according to an embodiment as the display 134.

FIGS. 8A through 8G illustrate a mobile terminal equipment, specifically, a cellular phone to which the present application can be applied, in which FIG. 8A is its front view in an opened state, FIG. 8B is its side view in the opened state, FIG. 8C is its front view in a closed state, FIG. 8D is its left side view in the closed state, FIG. 8E is its right side view in the closed state, FIG. 8F is its top view in the closed state, and FIG. 8G is its bottom view in the closed state. The cellular phone according to this application example includes an upper casing 141, a lower casing 142, a connecting portion (hinge in this example) 143, a display 144, a sub-display 145, a picture light 146, a camera 147, etc., and can be manufactured by using the display devices according to an embodiment as the display 144 and sub-display 145.

Examples

A description will next be made specifically of synthesis examples of amine compounds as specified in the working example an embodiment and examples of the organic electroluminescent device according to the working example of an embodiment, the examples making use of the amines. Synthesis Examples 1 to 6 of the amine compounds as specified in the working example of the present application will be described first, followed by a description of fabrication procedures of organic electroluminescent devices making use of these amine compounds and organic electroluminescent devices as comparative examples and further by a description of their evaluation results.

Synthesis Example 1

Following the below-described reaction formula, N,N,N',N'-tetrakis(p-biphenyl)-2,2'-bithiophene [the structural formula (21) in Table 2], an amine compound useful in the present application, was synthesized as will be described hereinafter.

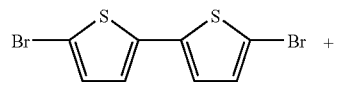

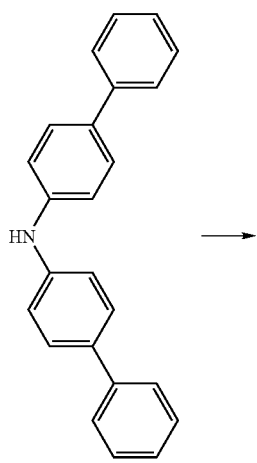

-continued

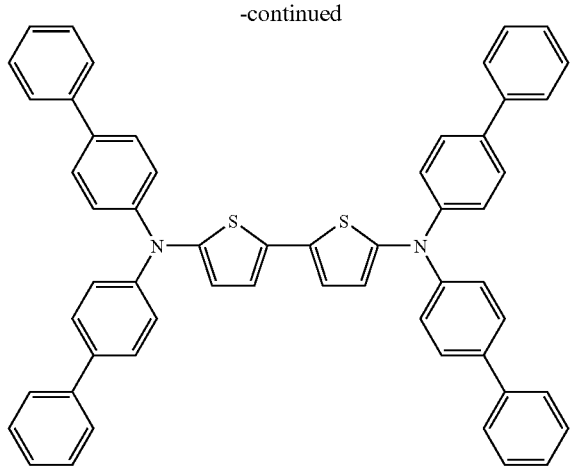

Described specifically, after a 500-mL three-necked flask fitted with a mechanical stirrer was thoroughly purged with nitrogen, N,N'-di(p-biphenyl)amine (32.4 g, 100 mmol), 5,5'-dibromo-2,2'-bithiophene (16.2 g, 50 mmol) and sodium tert-butoxide (5 g, 50 mmol) were dissolved in toluene (100 mL). The resulting solution was bubbled with nitrogen for 10 minutes to fully drive off dissolved oxygen from the solution. Palladium acetate (1.1 g, 5 mmol) was then added at once as a palladium catalyst component, and under stirring, a solution of tri(t-butylphosphine) (4.0 g, 20 mmol) in toluene (20 mL) was added dropwise. After completion of the dropwise addition of the solution in its entirety, heating was initiated, and a reaction was conducted at reflux temperature for 8 hours.

Subsequent to completion of the reaction, the reaction mixture was allowed to cool down to room temperature. After insoluble matter was separated by Celite, the organic layer was washed five times with water, and the organic layer was dried over magnesium sulfate. The resulting solution was concentrated, and a solution of the thus-obtained concentrate in a mixed solvent of hexane and toluene was caused to pass through a silica column to obtain a compound (1) as a yellow solid (10.5 g, yield: 45%). The thus-obtained solid was measured by $^1$H-NMR, $^{13}$C-NMR and FD-MS. As a result, the compound (1) was identified as N,N,N',N'-tetrakis(p-biphenyl)-2,2'-bithiophene, i.e., the target compound.

Synthesis Example 2

A compound (2) [the structural formula (10) in Table 1], another amine compound useful in the present application, was obtained by conducting its synthesis under similar conditions as in Synthesis Example 1 except that as a raw material, N,N'-diphenylamine was used in place of N,N'-di(p-biphenyl)amine. The thus-obtained solid was measured by $^1$H-NMR, $^{13}$C-NMR and FD-MS. As a result, the compound (2) was identified as the target compound.

Synthesis Example 3

A compound (3) [the structural formula (23) in Table 2], a further amine compound useful in the present application, was obtained by conducting its synthesis under similar conditions as in Synthesis Example 1 except that as a raw material, N-phenylnaphthalen-1-amine was used in place of N,N'-di(p-biphenyl)amine. The thus-obtained solid was measured by $^1$H-NMR, $^{13}$C-NMR and FD-MS. As a result, the compound (3) was identified as the target compound.

Synthesis Example 4

A compound (4) [the structural formula (24) in Table 2], a further amine compound useful in an embodiment, was obtained by conducting its synthesis under similar conditions as in Synthesis Example 1 except that as a raw material, N-phenylnaphthalen-2-amine was used in place of N,N'-di(p-biphenyl)amine. The thus-obtained solid was measured by $^1$H-NMR, $^{13}$C-NMR and FD-MS. As a result, the compound (4) was identified as the target compound.

Synthesis Example 5

A compound (5) [the structural formula (5) in Table 1], a yet further amine compound useful in an embodiment, was obtained by conducting its synthesis under similar conditions as in Synthesis Example 1 except that as a raw material, 2,5-dibromothiophene was used in place of 5,5'-dibromo-2, 2'-bithiophene. The thus-obtained solid was measured by $^1$H-NMR, $^{13}$C-NMR and FD-MS. As a result, the compound (5) was identified as the target compound.

Synthesis Example 6

A compound (6) [the structural formula (38) in Table 3], an even further amine compound useful in the present application, was obtained by conducting its synthesis under similar conditions as in Synthesis Example 1 except that as a raw material, 5,5"-dibromo-2,2':5,2"-terthiophene was used in place of 5,5'-dibromo-2,2'-bithiophene. The thus-obtained solid was measured by $^1$H-NMR, $^{13}$C-NMR and FD-MS. As a result, the compound (6) was identified as the target compound.

As shown above in Synthesis Examples 1 to 6, it has been confirmed that the amine compound for use in the present application can be synthesized through a simple route.

Fabrication of Organic Electroluminescent Devices

Examples 1 to 6

Using the compounds (1) to (6) obtained in Synthesis Examples 1 to 6, organic electroluminescent devices (see FIG. 1) of Examples 1 to 6 were fabricated as will be described hereinafter.

On a substrate 12 made of a 30 mm×30 mm glass plate, an Ag alloy layer (reflecting layer) was formed first to a thickness of 190 nm. An ITO transparent electrode of 12.5 nm was then stacked as an anode 13 on the Ag alloy layer to fabricate a cell for an organic electroluminescent device.

As a hole injection layer 14a, a film of m-MTDATA (4,4', 4"-tris(3-methylphenylphenylamino)triphenylamine) represented by the below-described structural formula (A) was next formed to a thickness of 10 nm on the anode 13 by vacuum evaporation (deposition rate: 0.2 to 0.4 nm/sec).

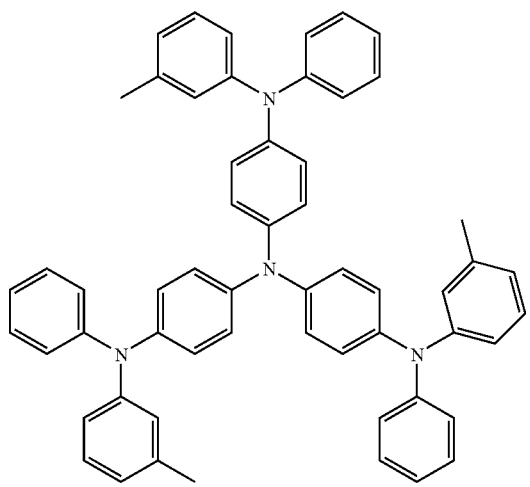

(A)

As a hole transport layer 14b, a film of one of the compounds (1) to (6) obtained as described above in the Synthesis Examples was then formed to a thickness of 30 nm by vacuum evaporation (deposition rate: 0.2 to 0.4 nm/sec).

On the hole transport layer 14b formed as described above, a light-emitting layer 14c was formed. As a host material, 9,10-di(2-naphthyl)anthracene (ADN) represented by the below-described formula (B) was vacuum-evaporated to form a film of 25 nm thickness. Upon conducting the vacuum evaporation, ADN was doped with "BD-052" (trade name for a blue dopant; product of Idemitsu Kosan Co., Ltd.) at 5% in terms of relative film thickness ratio to form the light-emitting layer 14c.

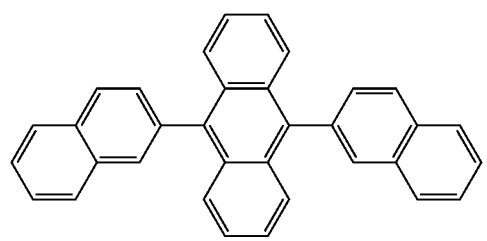

(B)

ADN

As an electron transport layer 14d, Alq3 (8-hydroxyquinoline aluminum) represented by the below-described structural formula (C) was then formed to a thickness of 20 nm by vacuum evaporation.

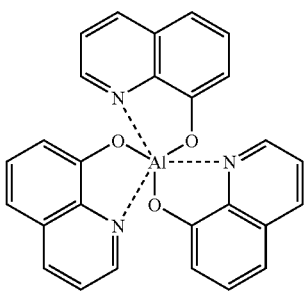
(C)

Subsequent to the foregoing, a film of Li$_2$O was formed to a thickness of about 0.3 nm as a first layer 15*a* of a cathode 15 by vacuum evaporation (deposition rate: 0.01 nm/sec). A film of MgAg was finally formed as a second layer 15*b* of the cathode 15 to a thickness of about 10 nm by vacuum evaporation.

In the above-described manner, organic electroluminescent devices of Examples 1 to 6 were fabricated by using the compounds (1) to (6), respectively.

Comparative Example 1

An organic electroluminescent device was fabricated in exactly the same manner as in Examples 1 to 6 except that in place of the compounds used for the formation of the hole transport layers 14*b* in Examples 1 to 6, a film of TPD represented by the below-described structural formula (D) was formed to a thickness of 30 nm (deposition rate: 0.2 to 0.4 nm/sec). It is to be noted that TPD means N,N'-diphenyl-N,N'-di(m-tolyl)benzidine.

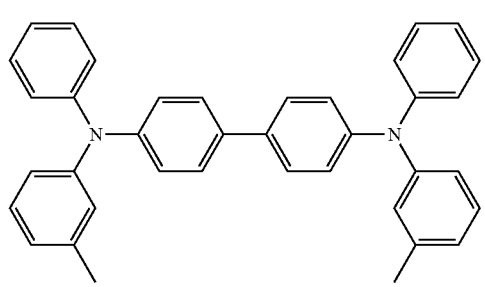
(D)

<Evaluation Results 1

The organic electroluminescent devices of Examples 1 to 6 and Comparative Example 1 fabricated as described above were each driven by a DC voltage to measure its drive voltage, emission brightness and emission color under application of a current at 10 mA/cm$^2$. The results are shown in Table 4. The term "emission life" indicates the value of brightness half-life when driven at a constant current with an initial brightness of 1,000 cd/m$^2$.

TABLE 4

|  | Material of hole transport layer 14b | Voltage (V) | Emission brightness (cd/m$^2$) | Emission color | Emission life (hours) |
| --- | --- | --- | --- | --- | --- |
| Example 1 | Compound (1) | 6.5 | 290 | Blue | 1010 |
| Example 2 | Compound (2) | 6.7 | 271 | Blue | 950 |
| Example 3 | Compound (3) | 6.6 | 268 | Blue | 900 |
| Example 4 | Compound (4) | 6.5 | 282 | Blue | 920 |
| Example 5 | Compound (5) | 6.9 | 257 | Blue | 826 |
| Example 6 | Compound (6) | 6.2 | 275 | Blue | 915 |
| Comp. Ex. 1 | TPD | 7.5 | 270 | Blue | 420 |

As shown in Table 4, the organic electroluminescent devices of Example 1 to 6, the hole transport layers 14*b* of which were formed using the compounds (1) to (6) which are amine compounds specified in the working example of an embodiment, were confirmed to be drivable at a lower voltage than the organic electroluminescent device of Comparative Example 1 the hole transport layer 14*b* of which was formed of TPD [the structural formula (D)]. Further, the emission lives of the organic electroluminescent devices of Example 1 to 6 all showed higher values than that of the organic electroluminescent device of Comparative Example 1. In, particular the emission life of the organic electroluminescent device of Example 1 was more than 2.4 times of that of the organic electroluminescent device of Comparative Example 1.

From these results, it has been confirmed that the formation of a hole transport layer with an amine compound specified in the working example of an embodiment makes it possible to fabricate an organic electroluminescent device which can be driven at a lower voltage and can show a longer emission life.

Fabrication of Organic Electroluminescent Devices

Examples 7 to 12

In the fabrication procedure described in Examples 1 to 6, specifically in the formation of the hole injection layer 14*a*, films of the respective compounds (1) to (6) obtained as described above in the Synthesis Examples in place of m-MT-DATA were formed to a thickness of 10 nm by vacuum evaporation (deposition rate: 0.2 to 0.4 nm/sec).

As a hole transport layer 14*b*, a film of α-NPD represented by the below-described structural formula (E) was then formed to a thickness of 30 nm (deposition rate: 0.2 to 0.4 nm/sec). α-NPD means N,N'-bis(1-naphthyl)-N,N'-diphenyl [1,1'-biphenyl]-4,4'-diamine.

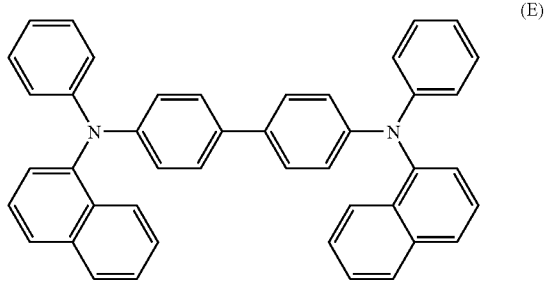
(E)

As an organic light-emitting layer 14c similar to the organic light-emitting layer 14c described in Example 1, ADN [the structural formula (B)] was vacuum-evaporated to form a film of 50 nm thickness. Upon conducting the vacuum evaporation, ADN was doped with a dopant represented by the below-described structural formula (F) at 6% in terms of relative film thickness ratio to form the organic light-emitting layer 14c.

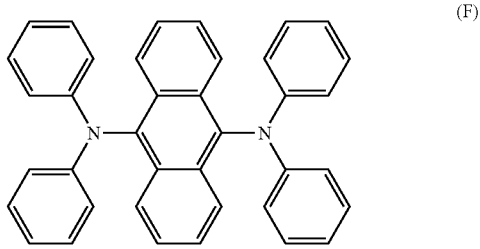
(F)

As an electron transport layer 14d, Alq3 was then formed to a thickness of 25 nm.

Subsequent to the foregoing, a film of LiF vas formed to a thickness of about 1.0 nm as a first layer 15a of a cathode 15 by vacuum evaporation (deposition rate: 0.01 nm/sec). A film of MgAg was finally formed as a second layer 15b of the cathode 15 to a thickness of about 10 nm by vacuum evaporation.

In the above-described manner, organic electroluminescent devices of Examples 7 to 12 were fabricated by using the compounds (1) to (6) in their hole injection layers 14a, respectively.

Comparative Example 2

An organic electroluminescent device was fabricated in exactly the same manner as in Examples 7 to 12 except that in place of the compounds used for the formation of the hole injection layers 14a in Examples 7 to 12, a film of m-MT-DATA was formed to a thickness of 10 nm (deposition rate: 0.2 to 0.4 nm/sec).

<Evaluation Results 2>

The organic electroluminescent devices of Examples 7 to 12 and Comparative Example 2 fabricated as described above were each driven by a DC voltage to measure its drive voltage, emission brightness and emission color under application of a current at 10 mA/cm$^2$. The results are shown in Table 5. The term "emission life" indicates a value at a time of a 10% decrease in brightness when driven at a constant current with an initial brightness of 4,000 cd/m$^2$.

TABLE 5

| | Material of hole transport layer 14b | Voltage (V) | Emission brightness (cd/m$^2$) | Emission color | Emission life (hours) |
|---|---|---|---|---|---|
| Example 7 | Compound (1) | 6.8 | 2320 | Green | 500 |
| Example 8 | Compound (2) | 6.9 | 2260 | Green | 450 |
| Example 9 | Compound (3) | 6.7 | 2160 | Green | 440 |
| Example 10 | Compound (4) | 6.6 | 2220 | Green | 420 |
| Example 11 | Compound (5) | 7.3 | 2110 | Green | 380 |
| Example 12 | Compound (6) | 6.9 | 2260 | Green | 460 |
| Comp. Ex. 2 | m-MTDATA | 8.7 | 2050 | Green | 310 |

As shown in Table 5, the organic electroluminescent devices of Example 7 to 12, the hole injection layers 14a of which were formed using the compounds (1) to (6) which are amine compounds specified in the working example of an embodiment, were confirmed to be drivable at a lower voltage than the organic electroluminescent device of Comparative Example 2 the hole injection layer 14a of which was formed of m-TDATA. Further, the emission lives of the organic electroluminescent devices of Example 7 to 12 all showed higher values than that of the organic electroluminescent device of Comparative Example 2. In particular, the emission life of the organic electroluminescent device of Example 7 was more than 1.6 times of that of the organic electroluminescent device of Comparative Example 2.

From these results, it has been confirmed that the formation of a hole injection layer with an amine compound specified in the working example of the present application makes it possible to fabricate an organic electroluminescent device which can be driven at a lower voltage and can show a longer emission life.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An organic electroluminescent device having an anode, a cathode, and at least one organic layer including a light-emitting layer provided between said anode and said cathode, wherein said organic layer includes an amine compound represented by the following formula (1):

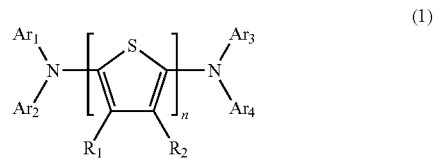
(1)

wherein Ar$_1$ to Ar$_4$ each independently represent a carbocyclic aromatic group having a total carbon number of from 6 to 20 or a heterocyclic aromatic group having a total carbon number of from 3 to 20;

an organic electroluminescent device having an anode, a cathode, and at least one organic layer including a light-emitting layer provided between said anode and said cathode, wherein said organic layer includes an amine compound represented by the following formula (1):

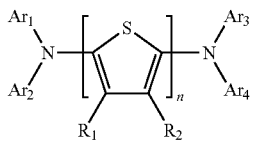

R1 and R2 each independently represent a halogen atom, a hydroxyl group, a substituted or unsubstituted carbonyl group having a carbon number of from 1 to 20, a substituted or unsubstituted carbonyl ester group having a carbon number of from 1 to 20, a substituted or unsubstituted alkenyl group having a carbon number of from 2 to 20, a cyano group, a nitro group or a heterocyclic aromatic group having a total carbon number of from 3 to 20; and n stands for an integer of 1, 2 or 3, and wherein a combination of At1 and Ar2 is the same as a combination of Ar3 and Ar4.

2. The organic electroluminescent device according to claim 1, wherein said amine compound is one of the formula (1) in which $Ar_1$ to $Ar_4$ are each independently selected from a substituted or unsubstituted phenyl, naphthyl, biphenyl, fluorenyl, anthryl, pyrenyl or fluoranthenyl group.

3. The organic electroluminescent device according to claim 1, wherein said amine compound is one of the formula (1) in which $Ar_1$ to $Ar_4$ are each independently selected from a phenyl, naphthyl or biphenyl group.

4. The organic electroluminescent device according to claim 1, wherein:
said organic layer has at least a light-emitting layer and a hole transport layer; and
said amine compound is used as a material forming said hole transport layer.

5. The organic electroluminescent device according to claim 1, wherein:
said organic layer has at least a light-emitting layer and a hole injection layer; and
said amine compound is used as a material forming said hole injection layer.

6. A display device comprising a plurality of organic electroluminescent devices formed in an array on a substrate, each of said organic electroluminescent devices having an anode, a cathode and at least one organic layer including a light-emitting layer provided between said anode and said cathode, wherein
in at least one of said organic electroluminescent devices, said at least one organic layer includes an amine compound represented by the following formula (1):

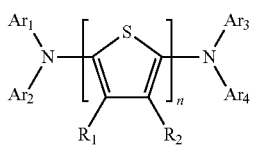

Ar1 to Ar4 each independently represent a carbocyclic aromatic group having a total carbon number of from 6 to 20 or a heterocyclic aromatic group having a total carbon number of from 3 to 20;
R1 and R2 each independently represent a halogen atom, a hydroxyl group, a substituted or unsubstituted carbonyl group having a carbon number of from 1 to 20, a substituted or unsubstituted carbonyl ester group having a carbon number of from 1 to 20, a substituted or unsubstituted alkenyl group having a carbon number of from 2 to 20, a cyano group, a nitro group or a heterocyclic aromatic group having a total carbon number of from 3 to 20; and n stands for an integer of 1, 2 or 3, and wherein a combination of At1 and Ar2 is the same as a combination of Ar3 and Ar4.

7. The display device according to claim 6, wherein
said at least one organic electroluminescent device in which said organic layer includes said amine compound is used as a common material for a blue-light emitting device, a green-light emitting device and a red-light emitting device to form a blue pixel, a green pixel and a red pixel, respectively.

8. An organic electroluminescent device having an anode, a cathode, and at least one organic layer including a light-emitting layer provided between said anode and said cathode, wherein
said organic layer includes an amine compound represented by the following formula (1):

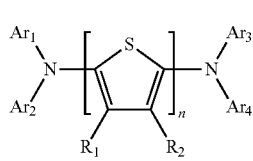

wherein Ar1 to Ar4 each independently represent a carbocyclic aromatic group having a total carbon number of from 6 to 20 or a heterocyclic aromatic group having a total carbon number of from 3 to 20; R1 and R2 each independently a halogen atom, a hydroxyl group, a substituted or unsubstituted carbonyl group having a carbon number of from 1 to 20, a substituted or unsubstituted carbonyl ester group having a carbon number of from 1 to 20 a substituted or unsubstituted alkenyl group having a carbon number of from 2 to 20, a cyano group, a nitro group, a carbocyclic aromatic group having a total carbon number of from 6 to 20 or a heterocyclic aromatic group having a total carbon number of from 3 to 20; and n stands for an integer of 1.

9. An organic electroluminescent device having an anode, a cathode, and at least one organic layer including a light-emitting layer provided between said anode and said cathode, wherein said organic layer includes an amine compound represented by the following formula (1):

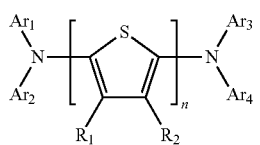
(1)

wherein at least one of $Ar_1$ to $Ar_4$ represent a substituted or unsubstituted naphthyl or biphenyl group;

$R_1$ and $R_2$ each independently represent a hydrogen atom, a halogen atom, a hydroxyl group, a substituted or unsubstituted carbonyl group having a carbon number of from 1 to 20, a substituted or unsubstituted carbonyl ester group having a carbon number of from 1 to 20, a substituted or unsubstituted alkyl group having a carbon number of from 1 to 20, a substituted or unsubstituted alkenyl group having a carbon number of from 2 to 20, a substituted or unsubstituted alkoxyl group having a carbon number of from 1 to 20, a cyano group, a nitro group, a carbocyclic aromatic group having a total carbon number of from 6 to 20 or a heterocyclic aromatic group having a total carbon number of from 3 to 20; and n stands for an integer of 1, 2 or 3, and wherein a combination of $Ar_1$ and $Ar_2$ is the same as a combination of $Ar_3$ and $Ar_4$.

\* \* \* \* \*